United States Patent
Seo et al.

(10) Patent No.: US 10,945,358 B2
(45) Date of Patent: Mar. 9, 2021

(54) FLEXIBLE ELECTROMAGNETIC WAVE SHIELDING MATERIAL, ELECTROMAGNETIC WAVE SHIELDING TYPE CIRCUIT MODULE COMPRISING SAME AND ELECTRONIC DEVICE FURNISHED WITH SAME

(71) Applicant: AMOGREENTECH CO., LTD., Gimpo-si (KR)

(72) Inventors: In Yong Seo, Seoul (KR); Ui Young Jeong, Incheon (KR); Jun Woo Lee, Bucheon-si (KR)

(73) Assignee: Amogreentech Co., Ltd., Gimpo-si (KR)

( * ) Notice: Subject to any disclaimer, the term of this patent is extended or adjusted under 35 U.S.C. 154(b) by 0 days.

(21) Appl. No.: 16/468,801

(22) PCT Filed: Dec. 12, 2017

(86) PCT No.: PCT/KR2017/014552
§ 371 (c)(1),
(2) Date: Jun. 12, 2019

(87) PCT Pub. No.: WO2018/110941
PCT Pub. Date: Jun. 21, 2018

(65) Prior Publication Data
US 2020/0100403 A1 Mar. 26, 2020

(30) Foreign Application Priority Data

Dec. 12, 2016 (KR) .......................... 10-2016-0168702
Dec. 12, 2016 (KR) .......................... 10-2016-0168705
(Continued)

(51) Int. Cl.
*H05K 1/00* (2006.01)
*H05K 1/18* (2006.01)
(Continued)

(52) U.S. Cl.
CPC ............... *H05K 9/009* (2013.01); *D01F 8/00* (2013.01); *H05K 1/181* (2013.01); *H05K 9/0022* (2013.01); *D10B 2401/16* (2013.01)

(58) Field of Classification Search
USPC .......................................................... 361/748
See application file for complete search history.

(56) References Cited

FOREIGN PATENT DOCUMENTS

| JP | H06152181 A | 5/1994 |
|----|----|----|
| JP | 2002043791 A | 2/2002 |

(Continued)

OTHER PUBLICATIONS

Park et al., "Fabrication and Application of Conducting Nanofibers by Electrospinning", Electrospinning, vol. 16, No. 3, 2013, pp. 67-80, English Abstract.

*Primary Examiner* — Andargie M Aychillhum
(74) *Attorney, Agent, or Firm* — Rothwell, Figg, Ernst & Manbeck, P.C.

(57) ABSTRACT

Provided is a flexible electromagnetic wave shielding material. An electromagnetic wave shielding material according to an embodiment of the present invention is implemented to include a conductive fiber web including a conductive composite fiber including a metal shell part covering an outside of a fiber part such that the conductive composite fiber forms multiple pores; and a first conductive component provided in at least some of the pores. The electromagnetic wave shielding material is so excellent in flexibility, elasticity, and creasing/recovery that the electromagnetic wave shielding material may be freely changed in shape, and can be brought in complete contact with a surface where the electromagnetic wave shielding material is intended to be disposed even if the surface has a curved shape such as an uneven portion or a stepped portion, thus exhibiting excellent electromagnetic wave shielding performance. Also, it is possible to prevent deterioration of the electromagnetic (Continued)

wave shielding performance even with various shape changes. Furthermore, even if parts are provided in a narrow area at a high density, the electromagnetic wave shielding material can be brought into complete contact with the mounted parts by overcoming a tight space between the parts and a stepped portion. Thus, the present invention can be easily employed for a light, thin, short, and small or flexible electronic device.

13 Claims, 11 Drawing Sheets

(30) Foreign Application Priority Data

Dec. 13, 2016 (KR) .................. 10-2016-0169487
Dec. 13, 2016 (KR) .................. 10-2016-0169488
Dec. 12, 2017 (KR) .................. 10-2017-0170428

(51) Int. Cl.
*H05K 7/00* (2006.01)
*H05K 9/00* (2006.01)
*D01F 8/00* (2006.01)

(56) References Cited

FOREIGN PATENT DOCUMENTS

| | | | |
|---|---|---|---|
| JP | 2014201862 A | | 10/2014 |
| KR | 20000059156 A | | 10/2000 |
| KR | 20030059146 A | | 7/2003 |
| KR | 20060111537 A | | 10/2006 |
| KR | 20090038994 A | | 4/2009 |
| KR | 20100126094 A | | 12/2010 |
| KR | 20110072946 A | | 6/2011 |
| KR | 20120086540 | * | 3/2012 |
| KR | 20120086540 A | | 8/2012 |
| KR | 20130136386 | * | 12/2013 |
| KR | 20130136386 A | | 12/2013 |
| KR | 20140054572 A | | 5/2014 |
| KR | 101424030 B1 | | 7/2014 |
| KR | 20150016897 A | | 2/2015 |
| KR | 101501057 B1 | | 3/2015 |
| KR | 20160005236 A | | 1/2016 |
| KR | 20170105987 A | | 9/2017 |

* cited by examiner

[Fig.1]
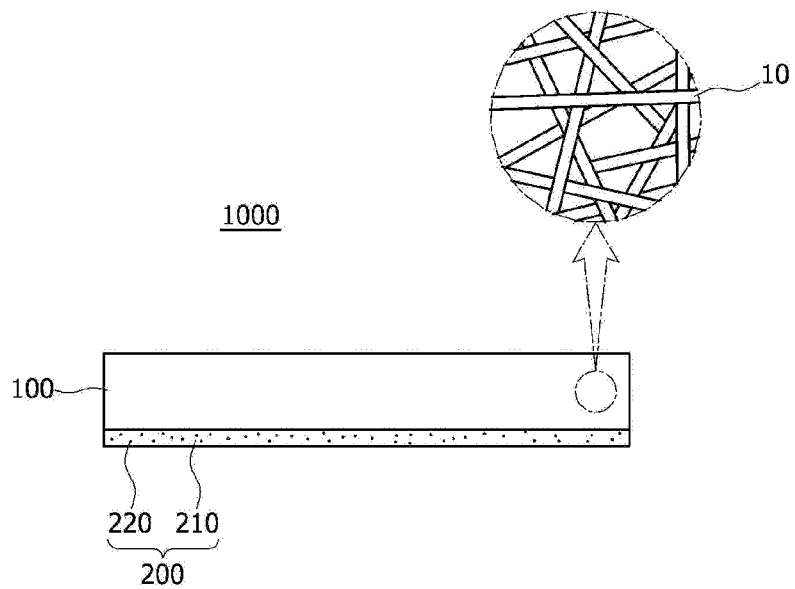
[Fig. 2]
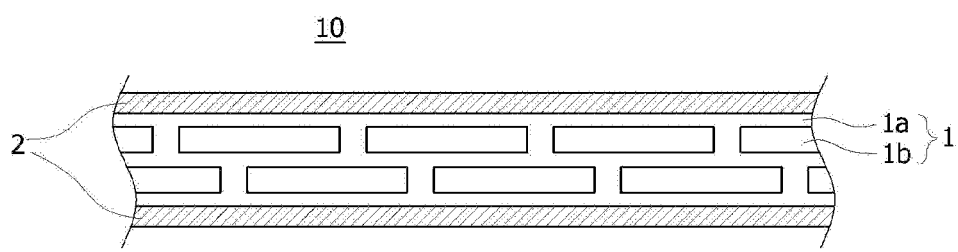

【Fig. 3】
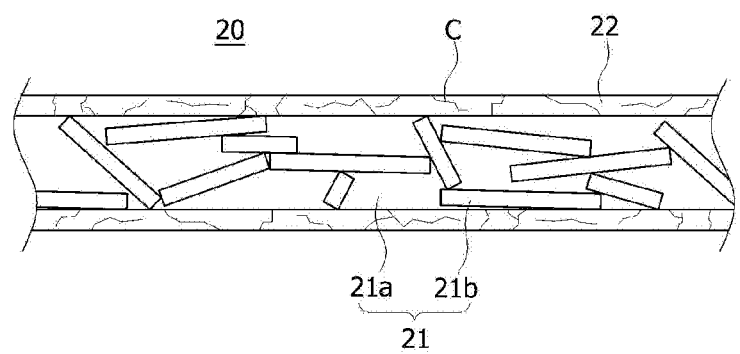
【Fig. 4a】
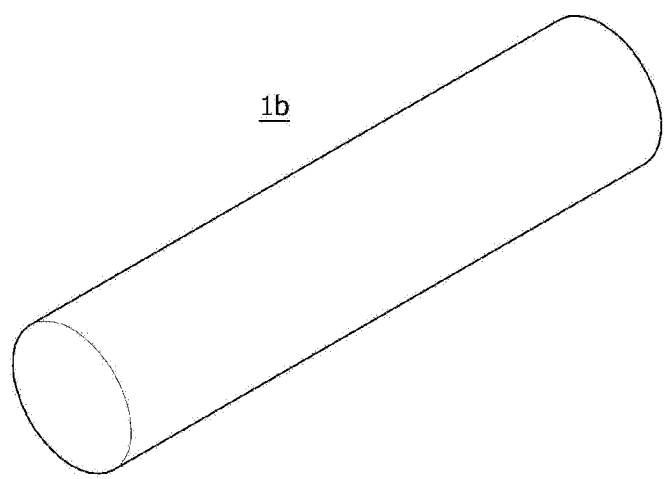

【Fig. 4b】
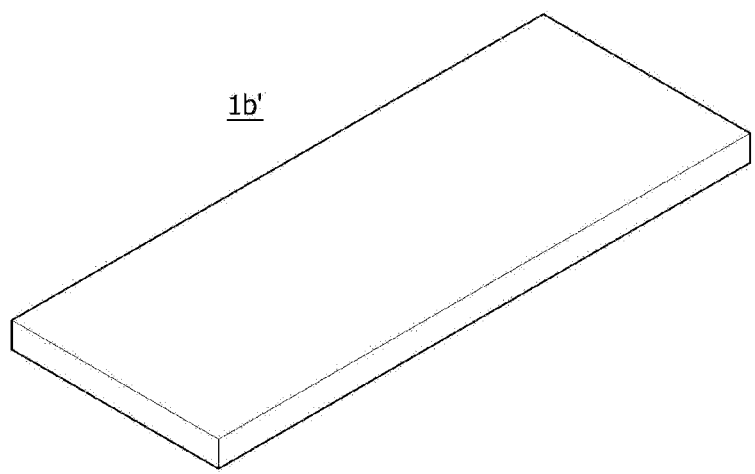
【Fig. 4c】
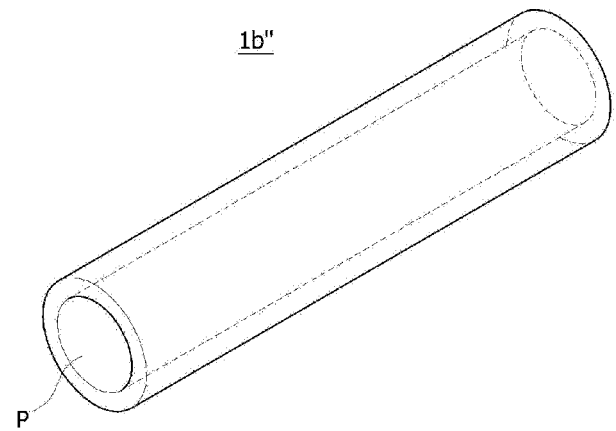

【Fig. 5a】
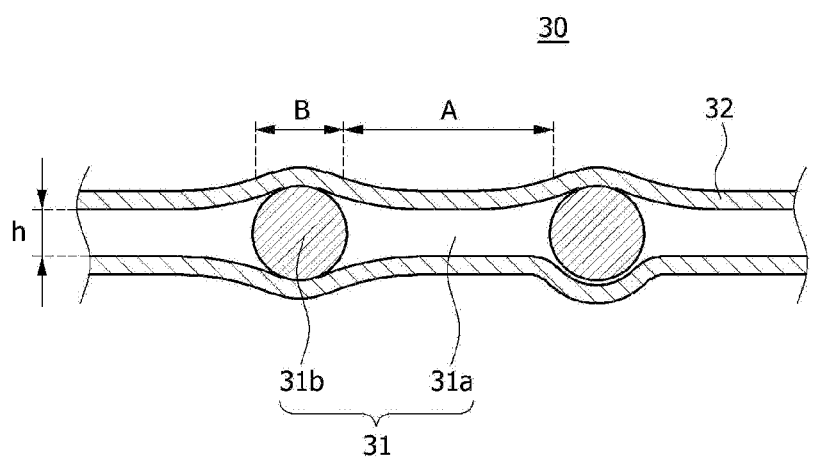
【Fig. 5b】
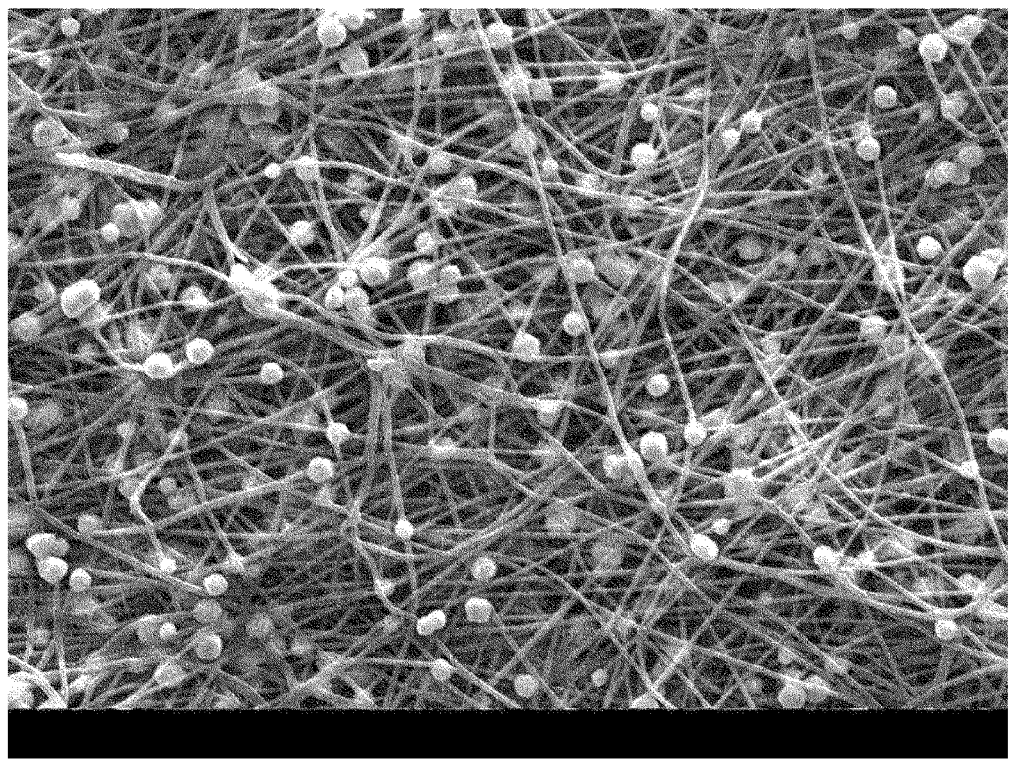

[Fig. 6a]
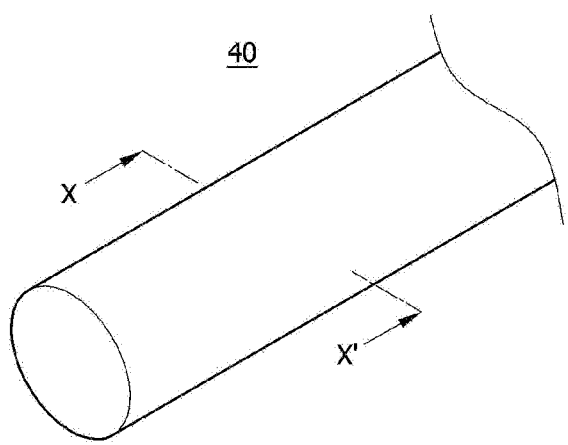
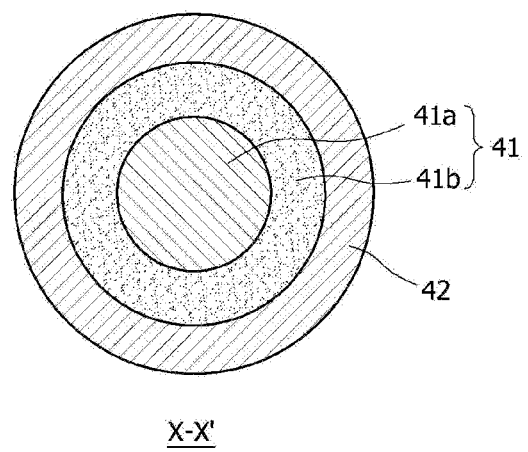
X-X'

[Fig. 6b]
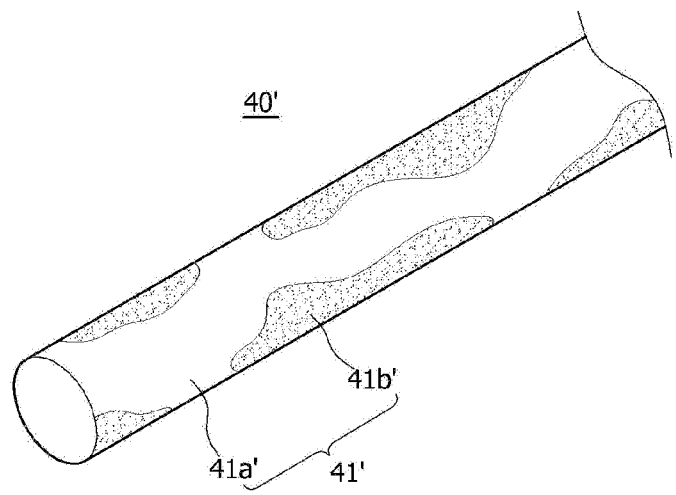
[Fig. 7]
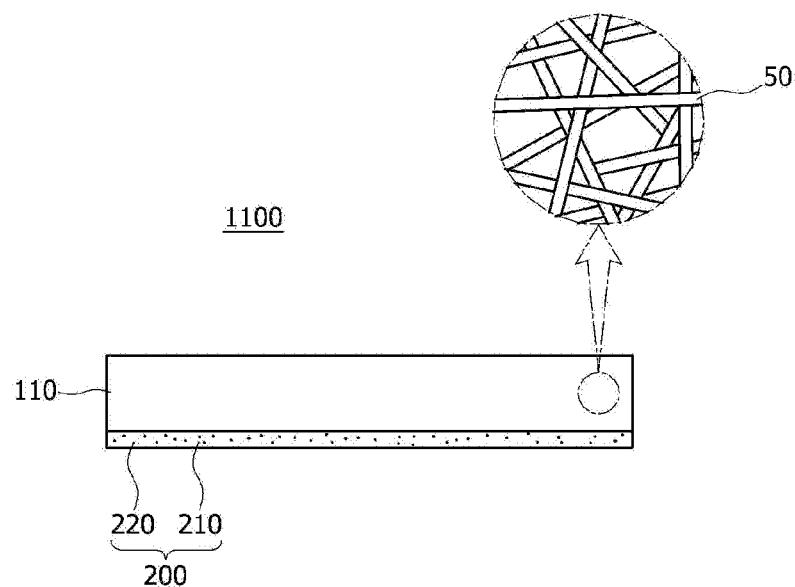

【Fig. 8】
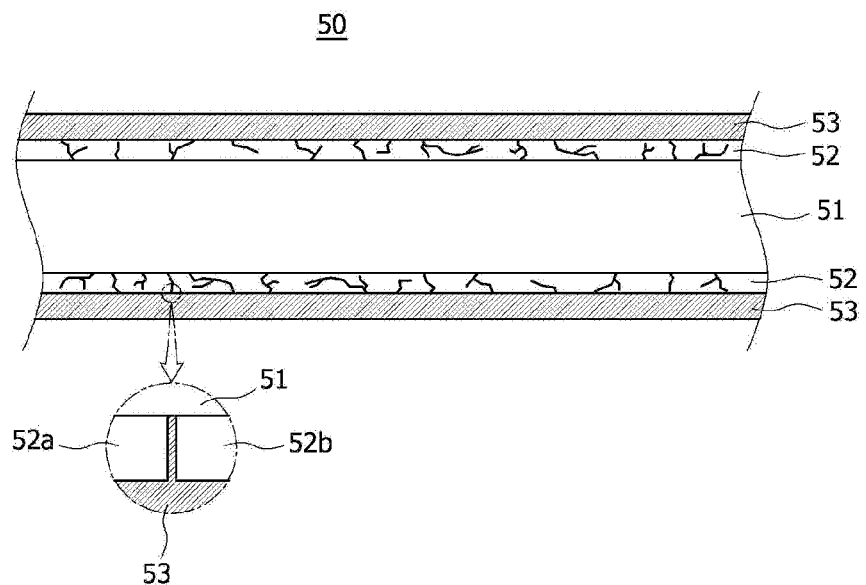
【Fig. 9】
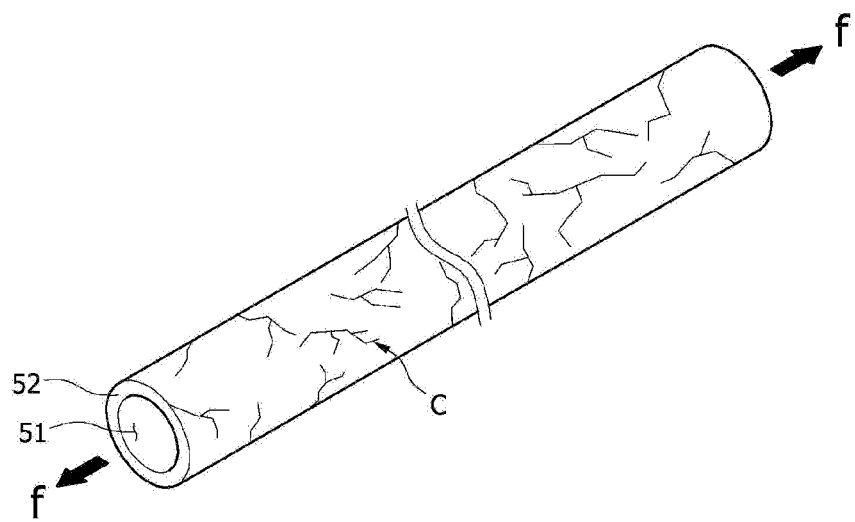

[Fig. 10]
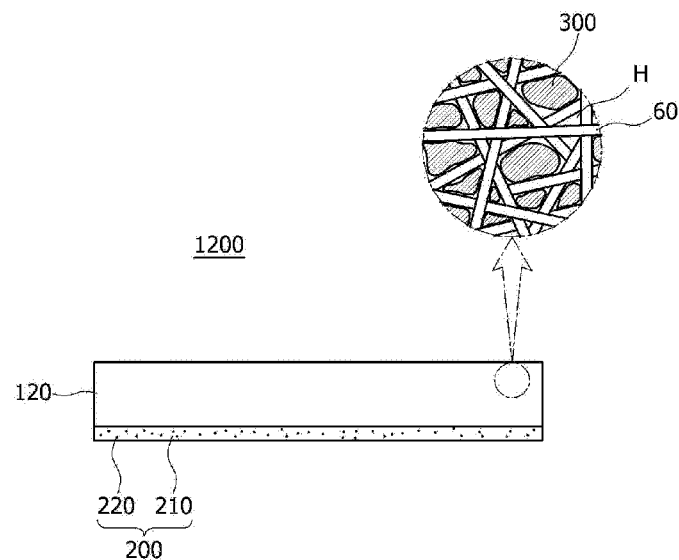
[Fig. 11]
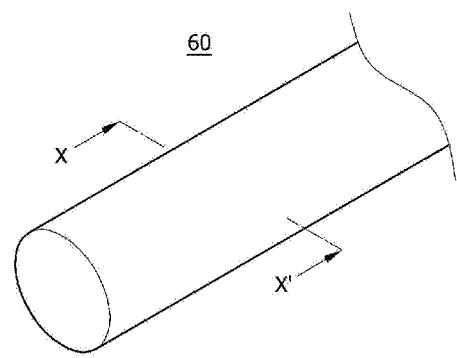
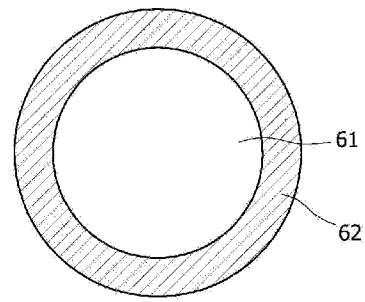
X-X'

【Fig. 12a】
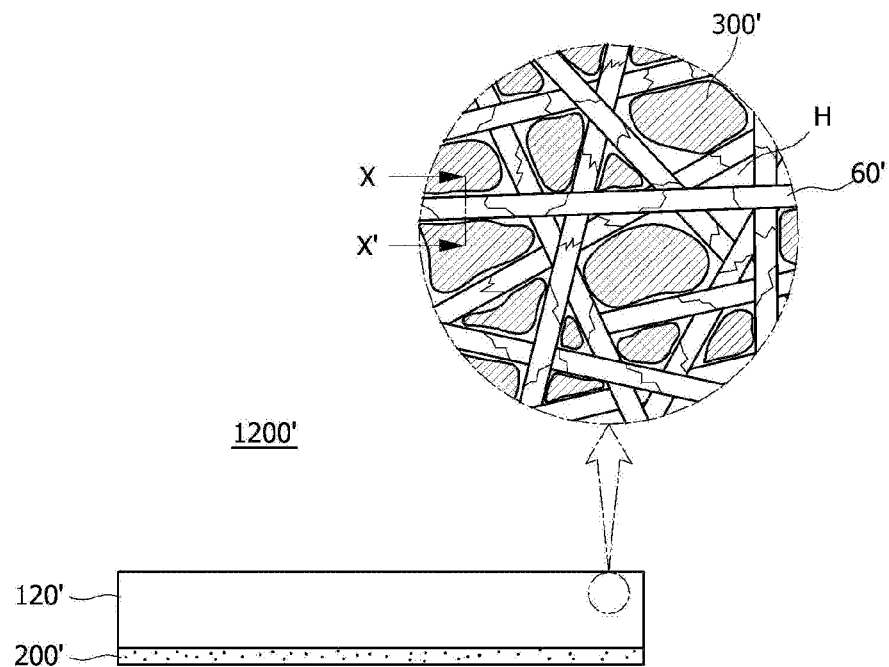
【Fig. 12b】
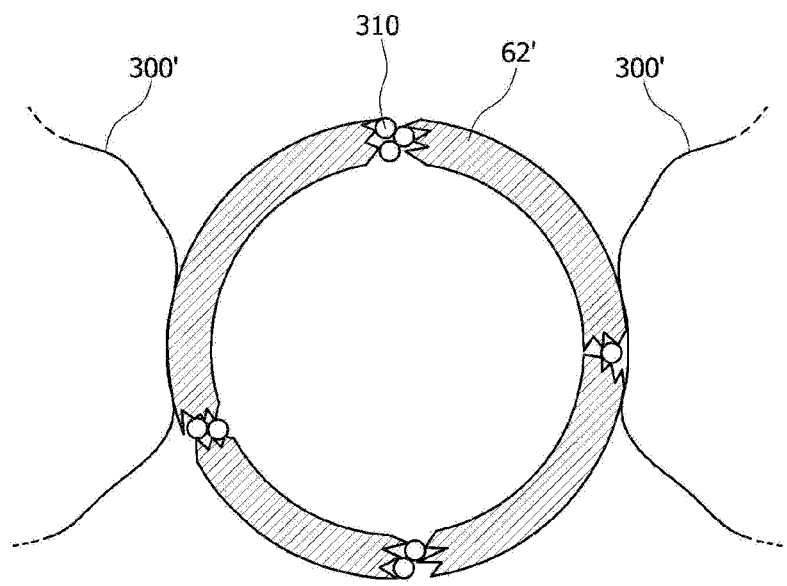
X - X'

[Fig. 13]
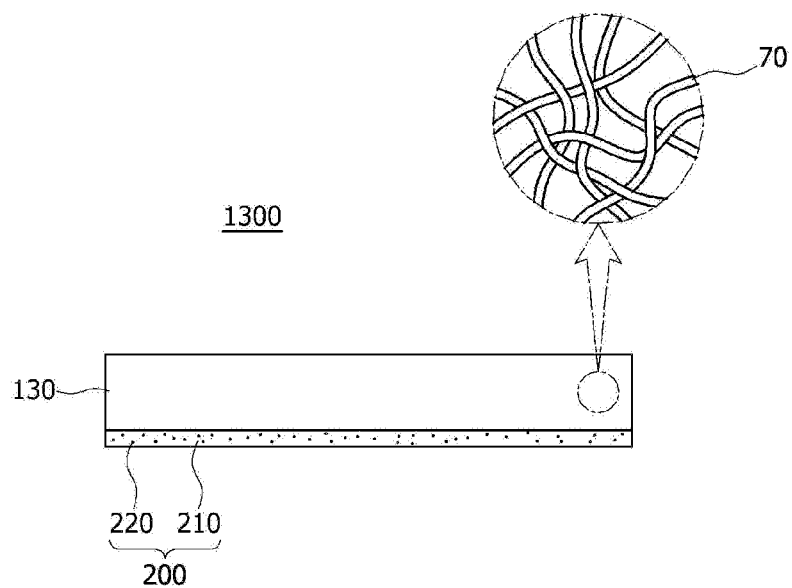
[Fig. 14]
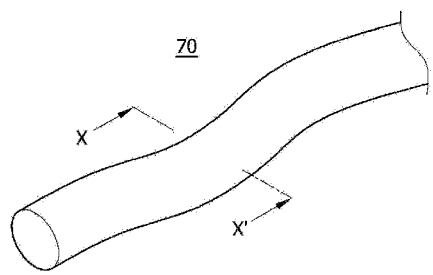
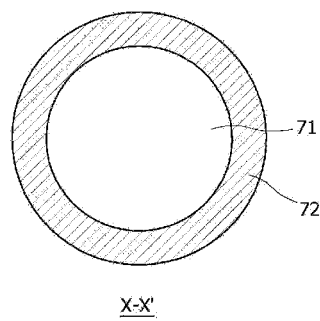

[Fig.15]
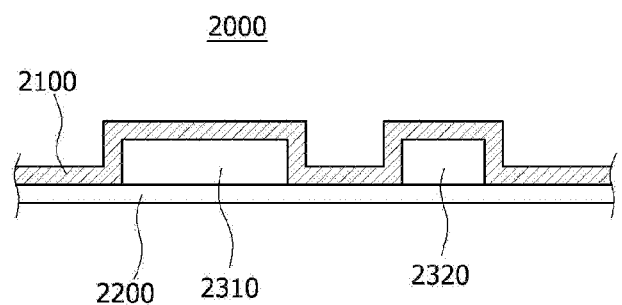

FLEXIBLE ELECTROMAGNETIC WAVE SHIELDING MATERIAL, ELECTROMAGNETIC WAVE SHIELDING TYPE CIRCUIT MODULE COMPRISING SAME AND ELECTRONIC DEVICE FURNISHED WITH SAME

CROSS REFERENCE TO RELATED APPLICATION

This application is a 35 U.S.C. 371 National Phase Entry Application from PCT/KR2017/014552, filed Dec. 12, 2017, which claims the benefit of Korean Patent Application Nos. 10-2016-1068702 filed Dec. 12, 2016, 10-2016-168705 filed Dec. 12, 2016, 10-2016-0169487 filed Dec. 13, 2016, 10-2016-0169488 filed Dec. 13, 2016 and 10-2017-0170428 filed Dec. 12, 2017, the disclosures of which are incorporated herein in their entirety by reference.

TECHNICAL FIELD

The present invention relates to an electromagnetic wave shielding material, and more particularly, to a flexible electromagnetic wave shielding material having excellent flexibility, elasticity, and creasing/recovery, an electromagnetic wave shielding-type circuit module including the same, and an electronic device having the same.

BACKGROUND ART

Electromagnetic radiation is a phenomenon in which energy moves in a sinusoidal waveform while an electric field and a magnetic field cooperate with each other, and the phenomenon is useful for wireless communication or electronic devices such as a radar. The electric field is generated by voltage and is easily shielded due to long distances or obstacles such as a tree while the magnetic field is generated by current and is inversely proportional to a distance but is not easily shielded.

A recent electronic device is sensitive to electromagnetic interference (EMI) generated by an internal or external interference source, and there is a possibility of a malfunction of the electronic device being caused by electromagnetic waves. Also, a user who is using an electronic device may be harmfully affected by electromagnetic waves generated by the electronic device.

Accordingly, there is a growing interest in electromagnetic wave shielding materials for protecting human bodies or components of an electronic device against electromagnetic waves emitted from an electromagnetic wave generation source or from an external source.

Such an electromagnetic wave shielding material is typically formed of a conductive material, and shields electromagnetic waves emitted toward the electromagnetic wave shielding material by reflecting the electromagnetic waves or directing the electromagnetic waves to the ground. An example of the electromagnetic wave shielding material may be a metal casing or a metal plate. In this case, it is difficult for the electromagnetic wave shielding material to exhibit flexibility and elasticity and it is not easy to change the electromagnetic wave shielding material to various shapes or to recover the electromagnetic wave shielding material. Thus, the electromagnetic wave shielding material is difficult to employ in various application fields. In particular, it may be difficult for the electromagnetic wave shielding material such as a metal plate or a metal thin film to fully exhibit electromagnetic wave shielding performance because the electromagnetic wave shielding material is difficult to bring into contact with a component requiring protection from an electromagnetic wave generating component or an electromagnetic wave source without a gap therebetween and also a crack may be generated due to bending at a stepped portion or an uneven portion.

In order to solve such a problem, an electromagnetic wave shielding material obtained by forming a conductive coating layer on a lightweight supporting member such as a polymer film has been recently produced. However, the electromagnetic wave shielding material has limitation on electromagnetic wave shielding performance in accordance with the limitation of an available area of the supporting member to be coated. Also, a film having a certain thickness or greater is insufficiently flexible, and thus may be difficult to bring into complete contact with components having a stepped portion or an uneven portion or to freely change in shape once manufactured in a specific shape. Even when the shape change is possible, a crack, a delamination, or the like may frequently be generated in a covered conductive coating layer during the shape change.

SUMMARY OF THE INVENTION

The present invention is designed to solve the above problems and is directed to providing a flexible electromagnetic wave shielding material that is so excellent in flexibility, elasticity, and creasing/recovery that the flexible electromagnetic wave shielding material is capable of being changed in shape freely at his/her disposal and thus can be provided into complete contact with various shapes/structures, such as an uneven portion or a stepped portion, of a surface to which the flexible electromagnetic wave shielding material will be applied.

Also, the present invention is also directed to providing a flexible electromagnetic wave shielding material capable of preventing deterioration of electromagnetic wave shielding performance even with various shape changes.

Further, the present invention is also directed to providing an electromagnetic wave shielding-type circuit module capable of being easily employed for a light, thin, short, and small or flexible electronic device having components provided in a small area at a high density, and an electronic device having the same.

In order to solve the above problems, according to a first implementation of the present invention, there is provided a flexible electromagnetic wave shielding material including a conductive fiber web formed to have a conductive composite fiber that includes a fiber part including conductive fillers and a metal shell part covering the outer surface of the fiber part.

According to an embodiment of the present invention, the conductive composite fiber may have a diameter of 0.2 μm to 10 μm. Also, the conductive fiber web may have a thickness of 5 μm to 200 μm and a basis weight of 5 g/m$^2$ to 100 g/m$^2$. Also, the conductive fiber web may have a porosity of 30% to 80%.

Also, the conductive fillers may contain one or more of a conductive polymer compound and one or more types of metals selected from the group consisting of aluminum, nickel, copper, silver, gold, chromium, platinum, titanium alloys, and stainless steel. In this case, the conductive polymer compound may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene) (PEDOT): polystyrene sulfonate (PSS).

Also, the conductive fillers may be made of a metal and may be provided to occupy 10% to 50% of the total volume of the fiber part.

Also, the fiber part may include a first part having conductive fillers, which are made of a metal, and a second part having no conductive fillers in the length direction of the conductive composite fiber. The second part and the conductive fillers may have a diameter ratio of 1:1 to 1:5.

Also, each of the conductive fillers may be a rod type having a predetermined aspect ratio. Preferably, the aspect ratio may range from 1.1 to 20. In this case, such a rod-type conductive filler may have a longitudinally continuous hollow cavity.

Also, when the conductive filler is a conductive polymer compound, the fiber part may contain 25 to 400 parts by weight of the conductive filler with respect to 100 parts by weight of a fiber forming component.

Also, the fiber part may include, as the fiber forming component, one or more types selected from the group consisting of polyurethane, polystyrene, polyvinylalcohol, polymethyl methacrylate, polylactic acid, polyethylene oxide, polyvinyl acetate, polyacrylic acid, polycaprolactone, polyacrylonitrile, polyvinylpyrrolidone, polyvinylchloride, polycarbonate, polyetherimide, polyethersulphone, polybenzimidazole, polyethylene terephthalate, polybutylene terephthalate, and fluorine-based compounds. In this case, preferably, the fiber part may include polyvinylidene fluoride (PVDF) and polyurethane. In this case, the PVDF and the polyurethane may be contained at a weight ratio of 1:0.2 to 1:2 and more preferably 1:0.4 to 1:5.

Also, the metal shell part may be made of one or more types of materials selected from the group consisting of aluminum, nickel, copper, silver, gold, chromium, platinum, titanium alloys, and stainless steel. Also, the metal shell part may have a thickness of 0.1 µm to 2 µm.

Also, at least some of the conductive fillers may be exposed to the outer surface of the fiber part to electrically communicate with the metal shell part.

Also, a conductive adhesive may be provided on at least one surface of the conductive fiber web.

Also, according to a second implementation of the present invention, there is provided a method of manufacturing a conductive composite fiber for a flexible electromagnetic wave shielding material, the method including (1) forming a first conductive part on an outer surface of a fiber part; (2) generating a crack in the first conductive part by elongating the fiber part having the first conductive part formed on the outer surface in the length direction; and (3) forming a second conductive part on an outer surface of the first conductive part.

According to an embodiment of the present invention, in step (2), the fiber part may be elongated by a factor of 1.1 to 20 compared to the length of the fiber part before the elongation.

Also, step (3) may include (3-1) keeping the fiber part elongated to secure a separation space in the crack generated in the first conductive part and (3-2) forming the second conductive part on the outer surface of the first conductive part including the separation space.

Also, according to the second implementation of the present invention, there is provided a conductive composite fiber for an electromagnetic wave shielding material, the conductive composite fiber including a first conductive part covering the outer surface of the fiber part and having a crack; and a second conductive part covering the outer surface of the first conductive part.

According to an embodiment of the present invention, the fiber part may include polyurethane and PVDF which is a fluorine-based compound as a fiber forming component. In this case, the PVDF and the polyurethane may be contained at a weight ratio of 1:0.2 to 1:2 and preferably 1:0.4 to 1:1.5.

Also, the first conductive part may be made of a metal, and the second conductive part may contain a conductive polymer compound. Also, the first conductive part may contain one or more types of materials selected from the group consisting of aluminum, nickel, copper, silver, gold, chromium, platinum, titanium alloys, and stainless steel. Also, the second conductive part may contain one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene) (PEDOT): polystyrene sulfonate (PSS).

Also, the conductive composite fiber may have a diameter of 0.2 µm to 10 µm. Also, the first conductive part may have a thickness of 0.1 µm to 2 µm, and the second conductive part have a thickness of 0.05 µm to 1 µm.

Also, a separation space in the crack of the first conductive part may be filled with the second conductive part.

Also, the present invention provides a flexible electromagnetic wave shielding material having a conductive fiber web including a fiber web formed of a fiber part, a first conductive part covering the outer surface of the fiber part and having a crack; and a second conductive part covering the outer surface of the first conductive part.

According to an embodiment of the present invention, the conductive fiber web may have a thickness of 5 µm to 200 µm and a basis weight of 5 g/m$^2$ to 100 g/m$^2$. Also, the conductive fiber web may have a porosity of 30% to 80%.

Also, a separation space in the crack of the first conductive part may be filled with the second conductive part.

Also, a conductive adhesive may be provided on at least one surface of the conductive fiber web.

Also, according to a third implementation of the present invention, there is provided a flexible electromagnetic wave shielding material including a conductive fiber web including a conductive composite fiber including a metal shell part covering an outside of a fiber part such that the conductive composite fiber forms multiple pores; and a first conductive component provided in at least some of the pores.

According to an embodiment of the present invention, in order to prevent an increase in resistance due to a crack generated in the metal shell part, the first conductive component may be provided in the pores to be in contact with at least a portion of the conductive composite fiber to provide electrical connection to the crack.

Also, the conductive composite fiber may have a diameter of 0.2 µm to 10 µm. Also, the conductive fiber web may have a thickness of 5 µm to 200 µm and a basis weight of 5 g/m$^2$ to 100 g/m$^2$. Also, the conductive fiber web may have a porosity of 30% to 80%.

Also, the first conductive component may contain metal particles, and 90% or more of the total metal particles may have particle diameters 0.8 times to 0.95 times an average pore diameter of the pores.

Also, the first conductive component may contain one or more of a conductive polymer compound and one or more types of metals selected from the group consisting of aluminum, nickel, copper, silver, gold, chromium, platinum, titanium alloys, and stainless steel. In this case, the conductive polymer compound may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene) (PEDOT): polystyrene sulfonate (PSS).

Also, the metal shell part may have a crack formed in at least a portion, and the flexible electromagnetic wave shielding material may further include a second conductive component interposed in a gap of the crack to provide electrical connection to the gap.

Also, the metal shell part may be made of one or more types of metals selected from the group consisting of aluminum, nickel, copper, silver, gold, chromium, platinum, titanium alloys, and stainless steel. Also, the metal shell part may have a thickness of 0.1 µm to 2 µm.

Also, the fiber part may contain polyvinylidene fluoride (PVDF) and polyurethane at a weight ratio of 1:0.2 to 1:2 as a fiber forming component.

Also, a conductive adhesive layer may be provided on at least one surface of the conductive fiber web.

Also, according to a fourth implementation of the present invention, there is provided a flexible electromagnetic wave shielding material including a conductive fiber web formed to have a conductive composite fiber that includes a fiber part provided with a crimp and a conductive part covering an outer surface of the fiber part.

According to an embodiment of the present invention, the conductive composite fiber may have a diameter of 0.2 µm to 10 µm. Also, the conductive fiber web may have a thickness of 5 µm to 200 µm and a basis weight of 5 g/m² to 100 g/m². Also, the conductive fiber web may have a porosity of 30% to 80%.

Also, the fiber part may contain polyvinylidene fluoride (PVDF) and polyurethane at a weight ratio of 1:0.2 to 1:2.0 as a fiber forming component.

Also, the conductive part may contain one or more of a conductive polymer compound and one or more types of metals selected from the group consisting of aluminum, nickel, copper, silver, gold, chromium, platinum, titanium alloys, and stainless steel. In this case, the conductive polymer compound may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene) (PEDOT): polystyrene sulfonate (PSS). Also, the conductive part may have a thickness of 0.1 µm to 2 µm.

Also, the surface resistance value that is measured after the conductive fiber web is elongated by a factor of 1.2 in one axial direction and then the elongation force is removed may vary in the range of 10% or less with respect to the surface resistance value before the elongation.

Also, a conductive adhesive layer may be provided on at least one surface of the conductive fiber web.

Also, the present invention provides an electromagnetic wave shielding-type circuit module including a circuit board with a device mounted thereon and the electromagnetic wave shielding material according to the present invention provided on the circuit board to cover at least an upper portion and a lateral portion of the device.

Also, the present invention provides an electronic device including the electromagnetic wave shielding-type circuit module according to the present invention.

Advantageous Effects of the Invention

The electromagnetic wave shielding materials according to several implementations of the present invention are so excellent in flexibility, elasticity, and creasing/recovery that the electromagnetic wave shielding materials can be freely changed in shape at his/her disposal and can be attached to be in complete contact with even a curved shape, such as an uneven portion or a stepped portion, of a surface where the electromagnetic wave shielding material is to be disposed. Also, it is possible to prevent deterioration of the electromagnetic wave shielding performance even with various shape changes. Furthermore, even if parts are provided in a narrow area at a high density, the electromagnetic wave shielding materials can be provided in close contact with the mounted parts by overcoming a tight space between the parts and a stepped portion. Accordingly, it is possible to exhibit excellent electromagnetic wave shielding performance, and thus the present invention can be easily employed for a light, thin, short, and small or flexible electronic device.

DESCRIPTION OF THE DRAWINGS

FIG. 1 is a sectional view of a flexible electromagnetic wave shielding material according to an embodiment of a first implementation of the present invention.

FIGS. 2 and 3 are sectional views illustrating the structure and action of a conductive composite fiber included in an embodiment of the first implementation of the present invention.

FIGS. 4A to 4C are perspective views showing several examples of a conductive filler included in an embodiment of the first implementation of the present invention.

FIG. 5A is a partial sectional view of a conductive composite fiber included in an embodiment of the first embodiment of the present invention, and FIG. 5B is a scanning electron microscope (SEM) photograph of a conductive fiber web according to an embodiment of the first embodiment of the present invention.

FIGS. 6A and 6B are views of a conductive composite fiber included in an embodiment of the first implementation of the present invention, FIG. 6A shows a perspective view and a sectional view of the conductive composite fiber according to an embodiment of the first implementation, and FIG. 6B shows a perspective view according to another embodiment.

FIG. 7 is a sectional view of a flexible electromagnetic wave shielding material according to an embodiment of a second implementation of the present invention.

FIG. 8 is a sectional view of a conductive composite fiber included in an embodiment of the second implementation of the present invention.

FIG. 9 is a schematic view of step (2) of a method of manufacturing a conductive composite fiber included in an embodiment of the second implementation of the present invention.

FIG. 10 is a sectional view of a flexible electromagnetic wave shielding material according to an embodiment of a third implementation of the present invention.

FIG. 11 is a sectional view of a conductive composite fiber included in an embodiment of the third implementation of the present invention.

FIGS. 12A and 12B are a sectional view of a flexible electromagnetic wave shielding material and a sectional view taken along boundary line X-X' according to another embodiment of the third implementation of the present invention.

FIG. 13 shows a sectional view of a flexible electromagnetic wave shielding material and a partially enlarged sectional view of a conductive fiber web according to an embodiment of a fourth implementation of the present invention.

FIG. 14 is a cross-sectional view of a conductive composite fiber included in an embodiment of the fourth implementation of the present invention.

FIG. 15 is a sectional view of an electromagnetic wave shielding-type circuit module according to an embodiment of the present invention.

DETAILED DESCRIPTION OF THE INVENTION

Hereinafter, embodiments of the present invention will be described in detail with reference to the accompanying drawings so that they can be easily carried out by those skilled in the art. The present invention may, however, be embodied in many different forms and should not be construed as being limited to the embodiments set forth herein. In the accompanying drawings, portions irrelevant to the description of the present invention will be omitted for clarity. Moreover, like reference numerals refer to like elements throughout.

Referring to FIG. 1, a flexible electromagnetic wave shielding material 1000 according to an embodiment of a first implementation of the present invention may include a conductive fiber web 100 including conductive composite fibers 10 and further include a conductive adhesive layer 200 provided on one or both surfaces of the conductive fiber web 100.

The conductive fiber web 100 has a three-dimensional network structure including the conductive composite fibers 10. Thus, the conductive fiber web 100 may have multiple pores and have a porosity of 30% to 80%. As a result, it can be easily implemented as an electromagnetic wave shielding material with good elasticity and flexibility. Also, the conductive fiber web 100 may have an air permeability of 0.01 cfm to 2 cfm. When the air permeability is less than 0.01 cfm and a conductive adhesive layer is formed on one surface of the conductive fiber web, it may be difficult to impregnate a conductive adhesive layer forming composition into the pores of the fiber web. When the air permeability exceeds 2 cfm, the mechanical properties and electromagnetic wave shielding performance of the conductive fiber web may be deteriorated.

Also, the conductive fiber web 100 may have a thickness of 5 μm to 200 μm and a basis weight of 5 g/m$^2$ to 100 g/m$^2$. When the thickness of the conductive fiber web exceeds 200 μm, it may not be easy to form a metal shell part on a nanofiber included in the entire area outside and inside the fiber web, and also the elastic properties may be deteriorated. Also, when the thickness is less than 5 μm, the mechanical strength of the conductive fiber web may be deteriorated, the handling may become difficult, and the manufacturing may not be easy.

In order to satisfy an appropriate thickness, the conductive fiber web may be formed as a single conductive fiber web or by stacking a plurality of conductive fiber webs. When the plurality of conductive fiber webs are stacked, a conductive adhesive for bonding the conductive fiber webs to one another may further be interposed therebetween. The subsequent description of the conductive adhesive layer 200 may be applied to the conductive adhesive, and thus a description thereof will be omitted.

Also, when the basis weight of the conductive fiber web 100 is less than 5 g/m$^2$, the mechanical strength of the conductive fiber web may be lowered, the handling may become difficult, and the manufacturing may not be easy. When the basis weight exceeds 100 g/m$^2$, it may not be easy to form a metal shell part on a nanofiber included in the entire area outside and inside the fiber web, and the elastic properties may be deteriorated.

Such a conductive composite fiber 10 for forming the above-described conductive fiber web 100 includes a fiber part 1 including conductive fillers 1a dispersed in a fiber forming component 1a and a metal shell part 2 covering the outer surface of the fiber part 1, as shown in FIG. 2.

The conductive composite fiber 10 may have a diameter of 0.2 μm to 10 μm. When the diameter is less than 0.2 μm, handleability may be deteriorated, and the manufacturing may not be easy. When the diameter exceeds 10 μm, the elasticity and flexibility may be deteriorated, and electromagnetic wave shielding performance may be deteriorated when the conductive composite fiber 10 is attached to a target surface with a stepped portion or an uneven portion and/or when shape change occurs during use.

The fiber part 1 has a fiber forming component 1a and conductive fillers 1b dispersed in the fiber forming component 1a. The fiber part 1 may have a diameter of 0.15 μm to 5 μm, but the present invention is not limited thereto. The diameter of the fiber part 1 may be appropriately changed in consideration of the mechanical strength of the conductive composite fiber 10, the thickness of the metal shell part 2, and the content of the conductive fillers 1b provided therein.

The fiber forming component 1a is an entity that forms a fiber or a fiber web in a conductive composite fiber or a conductive fiber web. The fiber forming component allows exhibition of elasticity, compressibility, flexibility, and creasing/recovery. Any well-known polymer compound that may be typically formed in a fibrous shape may be used as the fiber forming component 1a without limitation. As an example, the fiber forming component 1a may contain one or more types selected from the group consisting of polyurethane, polystyrene, polyvinylalcohol, polymethyl methacrylate, polylactic acid, polyethylene oxide, polyvinyl acetate, polyacrylic acid, polycaprolactone, polyacrylonitrile, polyvinylpyrrolidone, polyvinylchloride, polycarbonate, polyetherimide, polyethersulphone, polybenzimidazole, polyethylene terephthalate, polybutylene terephthalate, and fluorine-based compounds. Also, the fluorine-based compound may include at least one compound selected from the group consisting of polytetrafluoroethylene (PTFE)-based compounds, tetrafluoroethylene-perfluoroalkyl vinyl ether copolymer (PFA)-based compounds, tetrafluoroethylene-hexafluoropropylene copolymer (FEP)-based compounds, tetrafluoroethylene-hexafluoropropylene-perfluoroalkyl vinyl ether copolymer (EPE)-based compounds, tetrafluoroethylene-ethylene copolymer (ETFE)-based compounds, polychlorotrifluoroethylene (PCTFE)-based compounds, chlorotrifluoroethylene-ethylene copolymer (ECTFE)-based compounds, and polyvinylidene fluoride (PVDF)-based compounds. Preferably, the fiber forming component 1a may be obtained by blending and then spinning PVDF, which is a fluorine-based compound, and polyurethane in a spinning solution in order for the fiber part 1 and the conductive fiber web 100 implemented with the fiber part 1 to exhibit enhanced elasticity, flexibility, heat resistance, chemical resistance, and mechanical strength. In this case, the PVDF and the polyurethane may be contained at a weight ratio of 1:0.2 to 1:2 and preferably 1:0.4 to 1:1.5. When the weight of the polyurethane is less than 0.2 times the weight of the PVDF, the flexibility, elasticity, and the like may be deteriorated. As a result, when the conductive fiber web is provided on a substrate having a stepped portion or a change in shape during use, the conductive fiber web may be torn or difficult to bring into contact with the stepped portion, and also electromagnetic wave shielding performance may be more deteriorated than initially designed, due to damage to the conductive fiber web. Also, when the weight of the polyurethane is more than two times the weight of the PVDF, a recovery force is lowered due to elongation or contraction, and thus a permanent shape change may be induced due to a failure to recover its original state before elongation or contraction. As a result, the deterioration of the electromagnetic wave shielding performance may be induced because a separation distance of a crack generated due to the permanent shape change cannot be reduced. Also, the chemical resistance may be significantly deteriorated, and thus the fiber part may be damaged while the metal shell part is being formed. Accordingly, the deterioration of the mechanical properties, such as yarn breakage of the fiber part or tearing of the fiber web, may occur due to the shape change such as the elongation/contraction, creasing, and the like of the conductive fiber web.

The conductive fillers 1b may allow exhibition of the electromagnetic wave shielding performance of the conductive fiber web along with the metal shell part 2. Furthermore, the conductive fillers 1b may allow exhibition of the electromagnetic wave shielding performance at a desired level by preventing an increase in resistance of the conductive fiber web even in a crack of the metal shell part 2 that may be generated during elongation/contraction, compression, and creasing of the conductive fiber web. Referring to FIG. 3, a conductive composite fiber 20 may have a crack C generated in a metal shell part 22 due to shape change such as elongation/contraction, creasing, and the like. In this case, the resistance of the metal shell part 22 may be greatly increased. However, conductive fillers 21b included in a fiber part 21 may come into contact with one another, and thus lengthwise resistance and vertical resistance of the conductive composite fiber 20 may be decreased. Also, any conductive filler 21b may come into contact with the metal shell part 22 with the crack C generated therein, and thus it is possible to further prevent an increase in resistance of the conductive fiber web and maintain the electromagnetic wave shielding performance.

Any well-known material with electrical conductivity may be used as the conductive fillers 1b and 21b without limitation. As an example, the electrically conductive material may include one or more materials among a conductive polymer compound and one or more types of metals selected from the group consisting of aluminum, nickel, copper, silver, gold, chromium, platinum, titanium alloys and stainless steel.

In this case, when the conductive fillers 1b and 21b are made of a metal, the conductive filler 1b and 21b may be provided to occupy 10 to 50% of the total volume of the fiber part. When the conductive fillers 1b and 21b are provided at less than 10% of the entire volume of the fiber part, it may be difficult to prevent a decrease in resistance due to connection between conductive fillers or an increase in resistance of the metal shell part with a crack generated therein. Also, when the conductive fillers 1b and 21b are provided in excess of 50% of the total volume of the fiber part, yarn breakage of the fiber part during fiber spinning may be significantly increased, and the mechanical strength may be significantly lowered even when implementation is made using a fiber web.

Also, the conductive fillers 1b and 21b have no limitation in terms of shape and may have a well-known shape such as a curved spherical, acicular or irregular shape employed without limitation. However, the conductive fillers 1b and 21b may have a rod shape with a predetermined aspect ratio in order to prevent an increase in resistance due to a crack of the metal shell part 2 or 22 that may be generated due to the shape change of the conductive fiber web. In this case, the aspect ratio may range from 1.1 to 20. When the aspect ratio is less than 1.1, the contact between the conductive fillers may become difficult, and the direct contact with the metal shell part with the crack generated therein may also become difficult. Also, the content of the fillers in the fiber part should be increased in order to induce the direct contact, but in this case, the mechanical strength of the conductive composite fiber may be significantly lowered. Also, when the aspect ratio exceeds 20, the conductive fillers may penetrate through the fiber part and damage the metal shell part when the composite fiber is bent. This may result in deterioration of electromagnetic wave shielding performance. As an example, the rod-shaped conductive fillers may have a diameter of 0.8 μm to 1.1 μm and a length of 1 μm to 5 μm.

Also, when the conductive fillers 1b and 21b are made of a metal, the conductive fillers 1b and 1b' may have a cross section having an outer periphery with a curved shape such as a circle or an ellipse or a regular shape including a polygon such as a quadrangle or a pentagon, as shown in FIGS. 4A and 4B, or an irregular shape. Alternatively, as shown in FIG. 4C, the conductive filler 1b" may have an aspect ratio and may have a longitudinal section having an outer periphery with a regular shape or an irregular shape and also a lengthwise continuous hollow portion. In this case, advantageously, the conductive filler 1b" having the hollow portion may allow exhibition of more excellent elastic properties of and lightening of the conductive fiber web.

When the conductive fillers are densely arranged on an inner side of the fiber part and are not exposed on an outer surface of the fiber part, it may be difficult to prevent an increase in resistance due to a crack of the metal shell part. Accordingly, it is preferable that the conductive fillers are as closely arranged on the outer surface of the fiber part as possible. In this case, it is not easy to adjust the positions of the conductive fillers while a spinning solution containing the conductive fillers is spun. As a result, according to an embodiment of the present invention, the conductive fillers may have a larger diameter than the fiber being spun so that the conductive fillers may be as closely placed on the outer surface of the fabric part as possible.

In detail, referring to FIG. 5, when a conductive filler 31b is made of a metal, a fiber part 31 may include a first part B having the conductive filler 31b made of the metal and a second part A not having the conductive filler 31b in the length direction of a conductive composite fiber 30. By setting the ratio of a diameter h of the second part A to a diameter of the conductive filler 31b to be 1:1 to 1:5 and preferably 1:2.5 to 1:5 to increase the possibility of the conductive filler 31b being exposed to the outer surface of the fiber part 31, it is possible to increase the possibility of contact with a metal shell part 32 and also to prevent an increase in resistance through the conductive filler 31b despite a crack generated in the metal shell part 32. When the diameter of the conductive filler is less than one time the diameter of the second part, the possibility of the conductive filler being exposed to the outer surface of the fiber part is decreased, and thus it is not possible to minimize the increase in resistance due to a crack or the like generated in the metal shell part. Also, when the diameter of the conductive filler is more than five times the diameter of the second part, yarn breakage may occur during fiber spinning or the mechanical strength of the implemented composite fiber or fiber web may be lowered. In addition, when the conductive fiber web is changed in shape, the shape change due to the contact between the conductive fillers may be further decreased.

Also, when the conductive filler 31b has a shape with an aspect ratio, the diameter of the conductive filler 31b corresponding to the second part A may be a short axis length. Also, when the conductive filler 31b has an irregular shape, the diameter of the conductive filler 31b may be a diameter of an inscribed circle of the cross section.

According to an embodiment of the present invention, the diameter of the conductive filler may range from 1 μm to 5 μm. Thus, the possibility of exposure to the outer surface of the fiber part increases, and thus it is possible to prevent a decrease in electromagnetic wave shielding efficiency. When the diameter is less than 1 μm, the decrease in electromagnetic wave shielding efficiency may not be minimized. When the diameter exceeds 5 μm, yarn breakage may occur in the fiber part during fiber spinning or the mechanical strength of the fiber web may be lowered.

As shown in FIGS. 6A and 6B, the conductive fillers included in the fiber part may be conductive polymer compounds 41b and 41b'. The conductive polymer compound 41b may be provided in a fiber part 41 by surrounding a fiber forming component 41a (see FIG. 6A), or the conductive polymer compound 41b' may be provided in a fiber part 41' by irregularly mixing the conductive polymer compound 41b' and a fiber forming component 41a' (see FIG. 6B). In this case, the conductive polymer compound 41b may be exposed to the outer surface of the fiber part 41 as shown in FIG. 6A, or the conductive polymer compound 41b' may be at least partially exposed to the outer surface of the fiber part 41' as shown in FIG. 6B. Accordingly, a metal shell part 42 may electrically communicate with the exposed conductive polymer compounds 41b and 41b', thus exhibiting more excellent electromagnetic wave shielding performance. Also, even when a crack is generated in the metal shell part 42 due to the elongation/contraction, creasing, and the like of conductive composite fibers 40 and 40' or conductive fiber webs implemented with the conductive composite fibers 40 and 40', electrical connection may be made in the gap of the crack of the metal shell part 42 through the conductive polymer compounds 41b and 41b' exposed to the outer surfaces of the fiber parts 41 and 41'. Thus, it is possible to further prevent deterioration of the electromagnetic wave shielding performance.

Any well-known polymer compound with electrical conductivity may be used as the conductive polymer compounds 41b and 41b' without limitation. As an example, a polymer resin including an electron withdrawing group may be used. The electron withdrawing group is also called an electron attracting group and refers to an atomic group that attracts electrons from nearby atomic groups by a resonance effect or an induction effect. The electron withdrawing group may include at least one of an oxadiazole group, an azole group, a benzothiadiazole group, a cyano group, a quinoline group, a boronyl group, a silyl group, a perfluorinated group, a halogen group, a nitro group, a carbonyl group, a carboxyl group, a nitrile group, a halogenated alkyl group, an amino group, and a sulfonyl group. As an example of the electron withdrawing group, the conductive polymer compound may include one or more types selected from the group consisting of polythiophene, poly(3,4-ethylenedioxythiophene), polyaniline, polyacetylene, polydiacetylene, poly(thiophenevinylene), polyfluorene, and poly(3,4-ethylenedioxythiophene) (PEDOT): polystyrene sulfonate (PSS).

Also, when the conductive fillers 41b and 41b' are conductive polymer compounds, the conductive fillers 41b and 41b' may be provided in an amount of 25 to 400 parts by weight and preferably 90 to 400 parts by weight with respect to 100 part by weight of the fiber forming component of the fiber part. When the conductive fillers are provided in an amount of less than 25 parts by weight with respect to the fiber forming component, it may be difficult to exhibit the electromagnetic wave shielding performance at a desired level or to electrically connect all the cracked portions when a crack is generated in the metal shell part. Thus, it may be difficult to maintain the electromagnetic wave shielding performance. Also, when the conductive fillers are provided in an amount of more than 400 parts by weight, the mechanical strength of the composite fiber may be lowered, and the spinning properties may be significantly deteriorated when the fiber part is manufactured.

The metal shell parts 2, 22, 32, and 42 covering the outer surface of the fiber part function to reduce the resistance of the conductive fiber web along with the above-described conductive fillers 1b,1b',1b'',21b,31b,41b, and 41b' to exhibit the electromagnetic wave shielding performance. Any typical metal material with electrical conductivity may be used as the metal shell parts 2, 22, 32, and 42 without limitation. As an example, the metal shell parts may be made of one or more types of materials selected from the group consisting of aluminum, nickel, copper, silver, gold, chromium, platinum, titanium alloys, and stainless steel. Also, as an example, the metal shell parts may be formed of three layers consisting of a nickel layer, a copper layer, and a nickel layer. In this case, the copper layer allows the conductive fiber web to have low electrical resistance, thereby exhibiting excellent electromagnetic wave shielding performance, minimizing cracks in the metal shell parts in spite of shape change, such as creasing and elongation/contraction, of the conductive fiber web, and also improving the elastic properties. Also, the nickel layer formed on the copper layer can prevent oxidation of the copper layer, thereby preventing deterioration of the electromagnetic wave shielding performance.

Also, the metal shell parts may have a thickness of 0.1 μm to 2.0 μm. When the thickness of the metal shell parts exceeds 2 μm, a crack and a delamination may be easily generated when the shape change is made due to bending of the conductive composite fibers 10, 20, 30, 40, and 40'. When the thickness of the metal shell parts is less than 0.1 μm, it may be difficult to exhibit electromagnetic wave shielding performance at a desired level, and the delamination of the metal shell parts may be induced by elongation due to an external force during use, thus increasing the resistance despite the conductive fillers.

The above-described conductive fiber web 100 may be manufactured by the following manufacturing method, but the present invention is not limited thereto.

The conductive fiber web 100 may be manufactured as a fiber web having a three-dimensional network structure through the manufactured conductive composite fibers 10, 20, 30, 40, and 40'. Alternatively, the conductive fiber web 100 may be manufactured through (1) spinning a spinning solution containing conductive fillers and a fiber forming component to manufacture a fiber web formed of a fiber part having the conductive fillers dispersed therein and (2) forming a metal shell part to cover the outer surface of the fiber part to manufacture a conductive fiber web.

First, the former method will be described. Such a conductive composite fiber may be manufactured by spinning the spinning solution containing the conductive fillers and the fiber forming component through an inner nozzle of a double-spinning nozzle, extruding a metal paste capable of forming the metal shell part through an outer nozzle, and then sintering the metal paste.

Alternatively, the conductive composite fiber may be manufactured by forming the metal shell part on the outer surface of the fiber manufactured through the spinning solution containing the conductive fillers and the fiber forming component. In this case, when a solvent appropriately selected according to the spinning method, the type of the provided fiber forming component, and the like is additionally contained in the spinning solution, the spinning solution may be a dissolving solution in which the fiber forming component is dissolved or a melt solution in which the fiber forming component is melted. The method of spinning the spinning solution may be appropriately selected in consideration of the desired diameter of the conductive composite fiber, the desired type of the fiber forming component, and the like. As an example, the method may be a method of extruding the spinning solution through a spinneret using pressure or by electrospinning. Also, dry spinning or wet spinning may be appropriately selected in consideration of the type of the fiber forming component, the type of the solvent contained in the spinning solution, and the like. However, the present invention has no particular limitation thereon.

The method of forming the metal shell part on the outer surface of the manufactured fiber may be performed through well-known metal coating and plating methods. As an example, the fiber may be immersed in the metal paste and then subjected to a drying process and/or a sintering process. Alternatively, electroless plating may be performed as the well-known plating method.

The manufactured conductive composite fiber may be used to manufacture a conductive fiber web by utilizing a well-known manufacturing method for a fiber web, for example, a dry non-woven fabric such as a chemical bonding non-woven fabric, a thermal bonding non-woven fabric, and an air-ray non-woven fabric, a wet non-woven fabric, a spunlace non-woven fabric, a needle punched non-woven fabric, or a melt blown non-woven fabric.

Next, the latter method for manufacturing the conductive fiber web 100 will be described. Alternatively, the conductive fiber web 100 may be manufactured through (1) spinning a spinning solution containing conductive fillers and a fiber forming component to manufacture a fiber web formed of a fiber part having the conductive fillers dispersed therein and (2) forming a metal shell part to cover the outer surface of the fiber part to manufacture a conductive fiber web.

In step (1), after the fiber containing the conductive fillers is manufactured by the above-described former method, the fiber web may be manufactured without forming the metal shell part. Alternatively, the fiber web may be implemented by performing a calendering process on a fiber mat obtained by a collector collecting and accumulating the spun conductive fillers and fiber forming component.

In step (2), the metal shell part is formed to cover the fiber part of the fiber web manufactured in step (1). For step (2), a well-known method for forming the metal shell part may be employed. As an example, the well-known method may include deposition, plating, conductive paste coating, and the like for the metal shell part. However, it may be difficult for the deposition of the metal shell part to exhibit an electromagnetic wave shielding effect at a desired level because the metal shell part may be deposited on only the outer surface of the fiber part located on a surface portion of the fiber web and also may be difficult to provide in the fiber part located on a center portion of the fiber web. Also, pores on the surface portion of the fiber web on which the metal shell part is deposited may be closed. Thus, the elastic properties of the fiber web may be deteriorated, and also the deposited portion may be easily broken or delaminated during elongation or contraction. Also, when the fiber web is coated with a conductive paste, the fiber part located on the center portion and the surface portion of the fiber web may be uniformly coated. However, the deterioration of the elastic properties due to the closing of the pores may be remarkable, and thus the breakage and delamination of the metal shell part during elongation or contraction may be severe. Accordingly, it is preferable that the metal shell part may be formed on the fiber web through plating. More preferably, the plating may be electroless plating.

A conductive adhesive layer 200 may be additionally provided on at least one surface of the conductive fiber web 100 formed to contain the above-described conductive composite fibers 10, 20, 30, 40, and 40', as shown in FIG. 1.

The conductive adhesive layer 200 may be a well-known conductive adhesive layer. As an example, the conductive adhesive layer 200 may be obtained by dispersing conductive fillers 220 in an adhesive matrix 210. The adhesive matrix may be formed of one or more types of resins selected from an acrylic resin and an urethane resin, and the conductive fillers may be one or more types selected from the group consisting of nickel, nickel-graphite, carbon black, graphite, alumina, copper, and silver. The conductive adhesive layer 200 may include 5 to 95 wt % of the conductive fillers 220 with respect to the total weight of the conductive adhesive layer 200.

Also, the conductive adhesive layer 200 may have a thickness of 10 μm to 30 μm. When the thickness of the conductive adhesive layer 200 is excessive, electromagnetic wave shielding performance may not be exhibited at a desired level because the vertical resistance of the electromagnetic wave shielding material 1000 may be increased.

The conductive adhesive layer 200 may be formed by treating and impregnating a conductive adhesive layer forming composition on one surface of the conductive fiber web 100 to be formed. Thus, a portion of the conductive adhesive layer 200 may be formed on the conductive fiber web 100, and the remaining portion may be located inside the conductive fiber web 100 by filling the pores of the conductive fiber web 100. Alternatively, unlike FIG. 1, all the portions of the conductive adhesive layer 200 may be disposed inside the conductive fiber web 100.

Next, a second implementation of the present invention will be described.

Referring to FIG. 7, a flexible electromagnetic wave shielding material 1100 according to an embodiment of the second implementation of the present invention may have a conductive fiber web 110 including conductive composite fibers 50 and further have a conductive adhesive layer 200 provided on one or both surfaces of the conductive fiber web 110.

As shown in FIG. 8, such a conductive composite fiber 50 includes a fiber part 51, a first conductive part 52 covering an outer surface of the fiber part 51 and including a crack, and a second conductive part 53 covering an outer surface of the first conductive part 52.

The crack formed in the first conductive part 52 complements the elasticity and flexibility of the fiber part 51 which may be decreased according to the covering of the first conductive part 52, and the second conductive part 53 formed on the first conductive part 52 with the crack formed therein serves to complement a decrease in electrical conductivity due to increased resistance caused by the generation of the crack. Preferably, the second conductive part 53 may infiltrate into a separation space of the first conductive part 52a and 52b with the crack generated therein to fill the separation space. Thus, it is possible to prevent an increase in resistance due to the crack of the first conductive part 52 and maintain the electrical conductivity at a desired level.

In order to manufacture the conductive composite fiber 50 with this structure, the manufacturing method may include (1) forming a first conductive part on an outer surface of a fiber part; (2) generating a crack in the first conductive part by elongating the fiber part having the first conductive part formed on the outer surface in the length direction; and (3) forming a second conductive part on an outer surface of the first conductive part while the fiber part is elongated.

First, in step (1) according to the present invention, the first conductive part is formed on the outer surface of the fiber part.

The fiber part 51 is disposed in a composite fiber core portion and is an entity for exhibiting elasticity and flexibility of the conductive composite fiber. The fiber part 51 serves as a support for supporting the first conductive part 52 and the second conductive part 53, which will be described below. Any well-known polymer compound that may be typically formed in a fibrous shape may be used as a fiber forming component of the fiber part 51 without limitation. Preferably, the fiber forming component may be obtained by blending and then spinning PVDF, which is a fluorine-based compound, and polyurethane in a spinning solution in order for the conductive composite fiber 50 to exhibit enhanced elasticity, flexibility, compressibility, heat resistance, chemical resistance, and mechanical strength. In this case, the PVDF and the polyurethane may be contained in a weight ratio of 1:0.2 to 1:2 and preferably 1:0.4 to 1:1.5. When the weight of the polyurethane is less than 0.2 times the weight of the PVDF, the flexibility, elasticity, and the like may be deteriorated. As a result, when the conductive fiber web is provided on a substrate having a stepped portion or a change in shape during use, electromagnetic wave shielding performance may be more deteriorated than initially designed. Also, when the weight of the polyurethane is more than two times the weight of the PVDF, a recovery force is lowered due to elongation or contraction. As a result, shape change may be induced because the recovery cannot be made to the elongated or contracted state during use and/or a process of generating a crack in the first conductive part in step (2), which will be described below. Also, the chemical resistance may be significantly deteriorated, and thus the deterioration of the mechanical properties, such as yarn breakage of the fiber part or tearing of the fiber web, may occur due to the shape change such as the elongation/contraction, creasing, and the like caused by a damage to the fiber part while the first conductive part or the second conductive part is being formed.

The fiber part 51 may be manufactured by a well-known method capable of manufacturing a fiber forming component in a fibrous shape. As an example, the fiber part 51 may be manufactured by a method of extruding a spinning solution through a spinneret using pressure or by electrospinning. Also, the fiber part 51 may be manufactured through dry spinning or wet spinning in consideration of the type of the fiber forming component, the type of the solvent contained in the spinning solution, and the like. The specific spinning methods may employ or change well-known procedures and conditions in an appropriate way in consideration of the type of the fiber forming component selected or the desired fineness of the fiber. Therefore, the present invention has no particular limitation thereon.

Any material with electrical connectivity and material compatibility with the fiber part 51 may be used as the first conductive part 52 formed on the outer surface of the above-described fiber part 51 without limitation. As an example, the first conductive part 52 may be made of one or more kinds of metals selected from the group consisting of aluminum, nickel, copper, silver, gold, chromium, platinum, titanium alloys, and stainless steel. When the first conductive part 52 is made of a metal, the first conductive part 52 may be formed through well-known metal coating and plating methods. As an example, the first conductive part 52 may be manufactured by immersing the fiber part in a metal paste and then performing a drying process and/or a sintering process. Alternatively, electroless plating may be performed as the well-known plating method.

Meanwhile, the first conductive part 52 may be obtained by stacking two or more types of materials. As an example, the first conductive part 52 may have a three-layer structure consisting of a nickel layer, a copper layer, and a nickel layer. As an example, the first conductive part 52 may be formed of three layers consisting of a nickel layer, a copper layer, and a nickel layer. In this case, the copper layer allows the conductive fiber web to have low electrical resistance, thereby exhibiting excellent electromagnetic wave shielding performance, minimizing a crack in the first conductive part in spite of shape change, such as creasing and elongation/contraction, of the conductive fiber web, and also improving the elastic properties. Also, the nickel layer formed on the copper layer can prevent oxidation of the copper layer, thereby preventing deterioration of the electromagnetic wave shielding performance.

Also, the first conductive part 52 may have a thickness of 0.1 μm to 2 μm. Preferably, the first conductive part 52 may have a thickness of 0.1 μm to 1 μm. When the thickness of the first conductive part exceeds 2 μm, an additional crack and delamination are easily generated during use when a shape change is made due to bending of the conductive composite fiber 50 or the like, in addition to the crack formed in step (2). When the thickness is less than 0.1 μm, a delamination is generated in step (2), which will be described below. Thus, the initial electromagnetic wave shielding performance may not be exhibited at a desired level even after the second conductive part is formed, and a fluctuation in the electromagnetic wave shielding performance may increase due to elongation or the like occurring during use.

Meanwhile, as the method of forming the first conductive part 52 on the outer surface of the fiber part 51, the fiber part 51 and the first conductive part 52 may be formed in an integrated manner without forming the first conductive part 52 on the outer surface of the already manufactured fiber part 51 as described above. In detail, when the first conductive part 52 is made of a metal, the first conductive part 52 may be formed outside the fiber part 51 in an integrated manner by spinning a spinning solution containing a fiber forming component through an inner nozzle of a double-spinning nozzle, extruding a metal paste capable of forming the first conductive part through an outer nozzle, and then sintering the metal paste.

Next, in step (2) according to the present invention, the fiber part 51 having the first conductive part 52 formed on the outer surface thereof is elongated in the length direction to generate a crack in the first conductive part 52. As described above, the crack serves to complement a decrease in flexibility of the fiber part due to the covering of the first conductive part to allow the conductive composite fiber to exhibit the flexibility while the first conductive part is formed. In order to generate the crack in the first conductive part, as shown in FIG. 9, the fiber part 51 outside which the first conductive part 52 is formed may be elongated (f) in the length direction to generate a crack c.

In this case, in step (2), the fiber part may be elongated by a factor of 1.1 to 20, preferably, 1.1 to 8, and more preferably 1.1 to 2 compared to the length before the elongation. When the fiber part is elongated by a factor of less than 1.1, cracking of the first conductive part is so insignificant that a flexibility complementation effect cannot be exhibited at a desired level. When the fiber part is elongated by a factor of more than 20, the first conductive part may be delaminated or may be changed in shape because recovery cannot be made after yarn breakage or elongation.

Next, in step (3) according to the present invention, the second conductive part 53 is formed on an outer surface of the first conductive part 52 while the fiber part 51 is elongated.

The second conductive part 53 serves to minimize or prevent an increase in resistance due to the crack formed in the first conductive part 52 by covering the outer surface of the first conductive part 52 in which the crack is generated. Preferably, step (3) may be performed through (3-1) keeping the fiber part 51 elongated to secure a separation space in the crack generated in the first conductive part 52 and (3-2) forming the second conductive part 53 on the outer surface of the first conductive part 52 including the separation space. That is, when the second conductive part is formed after the fiber part is elongated to generate a crack in the first conductive part and then is contracted, a fine gap of the crack of the first conductive part may still remain. In this case, the resistance increased due to the crack of the first conductive part may not be decreased to a desired level. In this case, by securing the separation space, which is a gap of the crack generated in the first conductive part 52, while the fiber part 51 is kept elongated like step (3-1) and covering the first conductive part 52 with the second conductive part 53 through step (3-2), it may be easy for the second conductive part 53 to infiltrate into a separation space of the crack of the first conductive part 52 to partially or entirely fill the separation space as well as to cover the outer surface of the first conductive part 52.

Any well-known conductive material may be used as the second conductive part 53 without limitation. Preferably, however, a conductive polymer compound may be used so as not to reduce the elasticity and flexibility of the fiber part. The description of the conductive polymer compound in the first implementation may be applied to the specific types of the conductive polymer compound, and thus a description thereof will be omitted.

In detail, the second conductive part may be formed through a second conductive part forming composition containing a conductive polymer compound and a dispersing solvent. The dispersing solvent may be a well-known solvent capable of smoothly dispersing a conductive polymer compound and may be selected differently depending on a selected conductive polymer compound. Therefore, the present invention has no particular limitation thereon. As an example, however, the dispersing solvent may be isopropyl alcohol. The conductive polymer compound and the dispersion solvent may be mixed at a weight ratio of 1:0.5 to 1:10, but the weight ratio may be changed depending on the types of conductive polymer compound and dispersing solvent selected.

The second conductive part forming composition may be formed on the first conductive part through a typical coating method. As an example, the second conductive part forming composition may be formed by a known method such as dip coating, bar coating, and comma coater.

The second conductive part 53 may have a thickness of 0.05 µm to 1 µm. When the thickness of the second conductive part is less than 0.05 µm, it may be difficult to prevent an increase in resistance due to the first conductive part with the crack generated therein, and also it may be difficult for the second conductive part to sufficiently fill the gap of the crack. Also, when the thickness of the second conductive part exceeds 1 µm, the electrical resistance of the conductive fiber web may suddenly increase due to the somewhat high electrical resistance of the conductive polymer compound despite the presence of the first conductive part, and thus it may be difficult to exhibit electromagnetic wave shielding performance at a desired level. Also, along with the increase in thickness of the second conductive part, the flexibility and the elongation properties may be deteriorated, and thus the conductive fiber web may be torn by an external force generated during use.

The conductive composite fiber 50 manufactured by the above-described method may have a diameter of 0.2 µm to 10 µm. When the diameter is less than 0.2 µm, the handling properties may be deteriorated, and the manufacturing may not be easy. When the diameter exceeds 10 µm, the elasticity may be deteriorated, and also the electromagnetic wave shielding performance may be deteriorated.

Meanwhile, the above-described conductive composite fiber 50 may be implemented in any one shape of a woven fabric, a knitted fabric, and a non-woven fabric and may be utilized as an electromagnetic wave shielding material. A specific method of fabricating the woven fabric, the knitted fabric, and the non-woven fabric may be a well-known method for weaving, knitting, and web-forming. Therefore, a special description thereof will be omitted in the present invention. The electromagnetic wave shielding material 1100 implemented by forming the conductive fiber web 110 through the above-described conductive composite fiber 50 will be described below as an example.

The conductive fiber web 110 has a three-dimensional network structure and includes multiple pores. The multiple pores may be formed by being surrounded by such conductive composite fibers 50, which are used as an example of forming the conductive fiber web 110.

The conductive fiber web 110 may have a porosity of 30% to 80% and thus may be easily implemented as a flexible electromagnetic wave shielding material with good elasticity. Also, the conductive fiber web 110 may have an air permeability of 0.01 cfm to 2 cfm. When the air permeability is less than 0.01 cfm and a conductive adhesive layer is formed on one surface of the conductive fiber web, it may be difficult to impregnate a conductive adhesive layer forming composition into the pores of the fiber web. When the air permeability exceeds 2 cfm, the mechanical properties and electromagnetic wave shielding performance of the conductive fiber web may be deteriorated.

Also, the conductive fiber web 110 may have a thickness of 5 µm to 200 µm and a basis weight of 5 g/m² to 100 g/m². When the thickness of the conductive fiber web exceeds 200 µm, it may not be easy to form the conductive part on the outer surface of the fiber part located at a center portion of the fiber web, and the elastic properties may be deteriorated.

Also, when the thickness is less than 5 µm, the mechanical strength of the conductive fiber web may be deteriorated, the handling may become difficult, and the manufacturing may not be easy.

In order to satisfy an appropriate thickness, the conductive fiber web 110 may be formed as a single conductive fiber web or by stacking a plurality of conductive fiber webs. When the conductive fiber web 110 is formed by stacking the plurality of conductive fiber webs, a conductive adhesive for bonding the conductive fiber webs to one another may further be interposed therebetween. The subsequent description of the conductive adhesive layer 200 may be applied to the conductive adhesive, and thus a description thereof will be omitted.

Also, when the basis weight of the conductive fiber web 110 is less than 5 g/m$^2$, the mechanical strength of the conductive fiber web may be lowered, the handling may become difficult, and the manufacturing may not be easy. When the basis weight exceeds 100 g/m$^2$, it may not be easy to form the conductive part on the outer surface of the fiber part located at the center portion of the fiber web, and the elastic properties may be deteriorated.

The conductive fiber web 110 may be manufactured by applying, to the manufactured conductive composite fiber 50, a well-known manufacturing method for a fiber web, for example, a dry non-woven fabric such as a chemical bonding non-woven fabric, a thermal bonding non-woven fabric, and an air-ray non-woven fabric, a wet non-woven fabric, a spunlace non-woven fabric, a needle punched non-woven fabric, or a melt blown non-woven fabric, but the present invention is not limited thereto.

Meanwhile, the conductive fiber web 110 may be manufactured as a fiber web first and then manufactured as a conductive fiber web, instead of being manufactured as a conductive fiber web through the separately manufactured conductive composite fiber 50 as described above.

In detail, the conductive fiber web 110 may be manufactured by a method including (I) forming a first conductive part on an outer surface of a fiber part forming a fiber web; (II) generating a crack in the first conductive part by elongating the fiber web in any one or more directions; and (III) forming a second conductive part on an outer surface of the first conductive part while the fiber part is elongated.

First, in step (I) according to the present invention, the first conductive part is formed on the outer surface of the fiber part forming the fiber web.

The fiber web may be manufactured by manufacturing the fiber part through chemical spinning or electrospinning and then performing a well-known fiber web manufacturing process. The method of manufacturing the fiber web through the fiber part manufactured through the electrospinning may include manufacturing the fiber web by performing a calendering process on a fiber mat obtained through collection and accumulation by a collector through the electrospinning. In the calendering process, heat and/or pressure may be applied to the fiber mat, and the temperature and pressure may be appropriately changed in consideration of the diameter of the fiber part and the desired basis weight, thickness and the like of the fiber web. Therefore, the present invention has no particular limitation thereon.

When the first conductive part is formed on the outer surface of the fiber part of the manufactured fiber web, the material of the first conductive part may be a metal, as described above. Deposition, plating, conductive paste coating or the like may be used as the method of forming of the first conductive part made of the metal on the fiber web. However, it may be difficult for the deposition of the first conductive part to exhibit an electromagnetic wave shielding effect at a desired level because the first conductive part can be deposited on only the outer surface of the fiber part located on a surface portion of the fiber web and also because it may be difficult for the first conductive part to be provided in the fiber part located on a center portion of the fiber web. Also, the first conductive part infiltrates into pores on the surface portion of the fiber web on which the first conductive part is deposited to fix the fiber part surrounding the pores. Thus, the elastic and flexible properties of the fiber web may be reduced, and the deposited first conductive part may be easily broken or delaminated when the fiber web with the deposited first conductive part is elongated and/or contracted or is bent.

Also, when the first conductive part is formed by coating the fiber web with a conductive paste, the first conductive part may be uniformly provided on the fiber part located on the surface portion and the center portion of the fiber web. However, even in this case, the first conductive part infiltrates into pores to fix the fiber part surrounding the pores. Thus, the elastic and flexible properties of the fiber web may be reduced, and the first conductive part may be easily broken or delaminated.

Accordingly, it is preferable that the first conductive part may be formed on the fiber web through plating. More preferably, the plating may be electroless plating.

Next, in step (II) according to the present invention, a crack is generated in the first conductive part by elongating the fiber web in any one or more directions.

In order to generate the crack in the first conductive part, it is preferable that the fiber web may be elongated by a factor of 1.1 to 20 compared to the length before the elongation in an elongation direction. When the fiber web is elongated by a factor of less than 1.1, it may be difficult to achieve a desired level of elasticity and flexibility. Also, when the fiber web is elongated by a factor of more than 20, the delamination of the first conductive part may be remarkably increased, resulting in deterioration of the electromagnetic wave shielding performance or tearing of the fiber web.

Next, in step (III) according to the present invention, the second conductive part is formed on the outer surface of the first conductive part in which the crack is generated. The description of the method of forming the second conductive part is the same as that of step (3) in the above-described method of manufacturing the conductive composite fiber, and thus a detailed description thereof will be omitted.

Meanwhile, preferably, step (III) may be performed while the fiber web is elongated. Thus, it may be easy for the second conductive part to infiltrate into a separation space in the crack of the first conductive part, and the electromagnetic wave shielding material can exhibit excellent electromagnetic wave shielding performance as well as elasticity and flexibility.

The method of forming the conductive fiber web implemented by forming the fiber web first and then forming the conductive part has been described above. When the electromagnetic wave shielding material is implemented in the form of a woven fabric or a knitted fabric rather than a fiber web, a conductive woven fiber or a conductive knitted fabric may be manufactured by manufacturing the woven fabric or the knitted fabric first, forming the first conductive part on the manufactured woven fabric or knitted fabric, elongating the fabric to generate a crack in the first conductive part, and then forming the second conductive part. In this case, it should be noted that a conductive shielding material implemented by manufacturing the conductive woven fiber or the conductive knitted fabric is also within the scope of the present invention.

The conductive fiber web 110 manufactured through the above-described method is implemented as the electromagnetic wave shielding material 1100 including the conductive fiber web 110. The conductive fiber web 110 includes the fiber web formed of the fiber part 51, the first conductive part 52 covering the outer surface of the fiber part 51 and including a crack, and the second conductive part 53 covering the outer surface of the first conductive part 52.

Also, as shown in FIG. 7, the conductive adhesive layer 200 may be additionally provided on at least one surface of the conductive fiber web 110. The conductive adhesive layer 200 may be a well-known conductive adhesive layer. A more detailed description is replaced with the above-description of the first implementation.

Next, a third implementation of the present invention will be described.

Referring to FIG. 10, a flexible electromagnetic wave shielding material 1200 according to an embodiment of the third implementation of the present invention may include a conductive fiber web 120 including multiple pores H and a first conductive component 300 provided inside at least some of the multiple pores H. The flexible electromagnetic wave shielding material 1200 may further include a conductive adhesive layer 200 provided on one or both surfaces of the conductive fiber web 120.

The conductive fiber web 120 has a three-dimensional network structure and includes the multiple pores H. The multiple pores H may be formed by being surrounded by conductive composite fibers 60 forming the conductive fiber web 120. The conductive fiber web 120 may have a porosity of 30% to 80% and thus may be easily implemented as a flexible electromagnetic wave shielding material with good elasticity. Also, the conductive fiber web 120 may have an air permeability of 0.01 cfm to 2 cfm. When the air permeability is less than 0.01 cfm and a conductive adhesive layer is formed on one surface of the conductive fiber web, it may be difficult to impregnate a conductive adhesive layer forming composition into the pores of the fiber web. When the air permeability exceeds 2 cfm, the mechanical properties and electromagnetic wave shielding performance of the conductive fiber web may be deteriorated.

Also, the conductive fiber web 120 may have a thickness of 5 μm to 200 μm and a basis weight of 5 g/m$^2$ to 100 g/m$^2$. When the thickness of the conductive fiber web exceeds 200 μm, it may not be easy to form a metal shell part of a conductive composite fiber, which is used as an example of forming the conductive fiber web 120, on a fiber included in the entire area outside and inside the fiber web, and also the elastic properties may be deteriorated. Also, when the thickness is less than 5 μm, the mechanical strength of the conductive fiber web may be deteriorated, the handling may become difficult, and the manufacturing may not be easy.

In order to satisfy an appropriate thickness, the conductive fiber web may be formed as a single conductive fiber web or by stacking a plurality of conductive fiber webs. When the plurality of conductive fiber webs are stacked, a conductive adhesive layer for bonding the conductive fiber webs to one another may further be interposed therebetween. The subsequent description of the conductive adhesive layer 200 may be applied to the conductive adhesive layer, and thus a description thereof will be omitted.

Also, when the basis weight of the conductive fiber web 120 is less than 5 g/m$^2$, the mechanical strength of the conductive fiber web may be lowered, the handling may become difficult, and the manufacturing may not be easy. When the basis weight exceeds 100 g/m$^2$, it may not be easy to form the metal shell part of the conductive composite fiber on the fiber included in the entire area outside and inside the fiber web, and the elastic properties may be deteriorated.

The conductive composite fiber 60 forming the above-described conductive fiber web 120 includes a fiber part 61 including a fiber forming component and a metal shell part 62 covering an outer surface of the fiber part 11, as shown in FIG. 11.

The fiber forming component of the fiber part 61 is an entity that forms a fiber or a fiber web in a conductive composite fiber or a conductive fiber web. The fiber forming component allows exhibition of elasticity, flexibility, and creasing/recovery of the fiber web. Any well-known polymer compound that may be typically formed in a fibrous shape may be used as the fiber forming component without limitation. As an example, the fiber forming component may be obtained by blending and then spinning PVDF, which is a fluorine-based compound, and polyurethane in a spinning solution in order for the fiber part 61 and the conductive fiber web 120 implemented with the fiber part 61 to exhibit enhanced elasticity, flexibility, heat resistance, chemical resistance, and mechanical strength. In this case, the PVDF and the polyurethane may be contained at a weight ratio of 1:0.2 to 1:2 and preferably 1:0.4 to 1:1.5. When the weight of the polyurethane is less than 0.2 times the weight of the PVDF, the flexibility, elasticity, and the like may be deteriorated. As a result, when the conductive fiber web is provided on a substrate having a stepped portion and a change in shape during use, the conductive fiber web may be torn or difficult to bring into contact with the stepped portion, and also electromagnetic wave shielding performance may be more deteriorated than initially designed, due to damage to the conductive fiber web. Also, when the weight of the polyurethane is more than two times the weight of the PVDF, a recovery force is lowered due to elongation or contraction, and thus a permanent shape change may be induced due to a failure to recover its original state before elongation or contraction. Also, the chemical resistance may be significantly deteriorated, and thus the fiber part may be damaged while the metal shell part is being formed. Accordingly, the deterioration of the mechanical properties, such as yarn breakage of the fiber part or tearing of the fiber web, may occur due to the shape change such as the elongation/contraction, creasing, and the like of the conductive fiber web.

Also, the metal shell part 62 functions to lower the resistance of the conductive fiber web to exhibit the electromagnetic wave shielding performance. Any typical metal material with electrical conductivity may be used as the metal shell part 62 without limitation. As an example, the metal shell part 62 may be made of one or more types of materials selected from the group consisting of aluminum, nickel, copper, silver, gold, chromium, platinum, titanium alloys, and stainless steel. As an example, the metal shell part may be formed of three layers consisting of a nickel layer, a copper layer, and a nickel layer. In this case, the copper layer allows the conductive fiber web to have low electrical resistance, thereby exhibiting excellent electromagnetic wave shielding performance, minimizing a crack in the metal shell part even during shape change, such as creasing and elongation/contraction, of the conductive fiber web, and also improving the elastic properties. Also, the nickel layer formed on the copper layer can prevent oxidation of the copper layer, thereby preventing deterioration of the electromagnetic wave shielding performance.

Also, the metal shell part 62 may have a thickness of 0.1 µm to 2 µm. When the thickness of the metal shell part exceeds 2 µm, a crack and a delamination may be easily generated while the shape change is made due to bending of the conductive composite fiber 60. Also, the increased thickness of the conductive part changes a pore diameter structure of the conductive fiber web, and thus it may be difficult to achieve a desired level of elasticity, flexibility, and the like. Also, when the thickness is less than 0.1 µm, it is not easy to form the metal shell part 62 to a small thickness, and also a crack or delamination may be very easily generated. Thus, it may be difficult to exhibit electromagnetic wave shielding performance at a desired level during elongation or contraction.

The conductive composite fiber 60 may have a diameter of 0.2 µm to 10 µm. When the diameter is less than 0.2 µm, the handling properties may be deteriorated, and the manufacturing may not be easy. When the diameter exceeds 10 µm, the elasticity may be deteriorated, and the electromagnetic wave shielding performance may be deteriorated.

The first conductive component 300 may be provided in some or all of the multiple pores H provided in the conductive fiber web 120 formed of the above-described conductive composite fiber 60. The first conductive component 300 may allow exhibition of the electromagnetic wave shielding performance along with the above-described conductive fiber web 120. Furthermore, the first conductive component 300 may allow exhibition of the electromagnetic wave shielding performance at a desired level by preventing an increase in resistance of the conductive fiber web even in a crack of the metal shell part 62 that may be generated during elongation/contraction and creasing of the conductive fiber web 120. To this end, preferably, the first conductive component 300 may be provided in contact with at least a portion of the conductive composite fiber 60 in a pore H formed by being surrounded by the conductive composite fiber 60. In this case, even though a crack is generated in the metal shell part 62 of the conductive composite fiber 60 of the conductive fiber web 120 due to the shape change such as elongation/contraction, creasing or the like of the electromagnetic wave shielding material, electrical connection may be made in a gap induced due to the crack by the first conductive component 300 that is provided in the pore H to be in contact with the conductive composite fiber 60. Thus, it is possible to minimize or prevent an increase in resistance of the conductive fiber web 120.

Any well-known material with electrical conductivity may be used as the first conductive component 300 without limitation. As an example, the electrically conductive material may include one or more materials among a conductive polymer compound and one or more types of metals selected from the group consisting of aluminum, nickel, copper, silver, gold, chromium, platinum, titanium alloys and stainless steel. The conductive polymer compound in the first implementation may be applied to the specific types of the conductive polymer compound, and thus a description thereof will be omitted.

Also, the first conductive component 300 may contain metal particles in order to greatly prevent an increase in resistance caused by a crack that may be generated in the metal shell part 62 and also to improve the electromagnetic wave shielding performance due to the first conductive component itself. In this case, the metal particles may have a particle diameter adjusted to be equal to or smaller than the pore diameters of the pores H so that the metal particles may be brought into contact with the metal shell part 62 when the metal particles are provided in the pores H. Preferably, the first conductive component having particles having particle diameters 0.80 to 0.95 times the average pore diameter of the pores, wherein the number of particles is 90% or more of the total number of metal particles, may be used. When metal particles having particle diameters less than 0.8 times the average pore diameter of the pores are contained at a ratio of 90% or more of the total metal particles, the possibility of the metal particles being brought into contact with the metal shell part 62 of the conductive composite fiber 60 may be low even though the metal particles are provided in the pores. Accordingly, it may not be possible to minimize or prevent an increase in resistance at a desired level when a crack is generated in the metal shell part due to elongation/contraction, bending, or the like. Also, when metal particles having particle diameters exceeding 0.95 times the average pore diameter of the pores are contained at a ratio of 90% or more of the total metal particles, the metal particles may be difficult to provide in the pores. Even though the metal particles are provided in the pores, the metal particles may be provided in only the pores exposed to the surface of the conductive fiber web and may be difficult to provide the inner pores. Accordingly, it may not be possible to minimize or prevent an increase in resistance at a desired level when a crack is generated in the metal shell part due to elongation/contraction, bending, or the like.

Also, preferably, when metal particles having particle diameters 0.80 to 0.95 times the average pore diameter of the pores are contained at a ratio of less than 90% of the total metal particles, the metal particles may be difficult to place in the pores to come into contact with the metal shell part, or the metal particles difficult to infiltrate into the pores itself may increase in number. Accordingly, it may not be possible to minimize or prevent an increase in resistance at a desired level when a crack is generated in the metal shell part due to elongation/contraction, bending, or the like.

Also, the first conductive component 300 may be provided with 11 to 900 parts by weight relative to 100 parts by weight of the conductive fiber web 120. When the first conductive component 300 is provided with less than 11 parts by weight relative to 100 part by weight of the conductive fiber web, it may be difficult to exhibit the electromagnetic wave shielding performance at a desired level or to electrically connect the cracked portions when a crack is generated in the metal shell part. Thus, it may be difficult to maintain the designed electromagnetic wave shielding performance. Also, when the first conductive component is provided with more than 900 parts by weight, the porosity of the conductive fiber web may decrease, the weight may increase, and the elasticity and flexibility may be significantly deteriorated. Also, when the electromagnetic wave shielding material is elongated/contracted or creased, the electromagnetic wave shielding performance may be deteriorated due to withdrawal of the first conductive component.

The above-described electromagnetic wave shielding material according to an embodiment of the present invention may be manufactured by (1) manufacturing a conductive fiber web, and (2) providing a first conductive component in at least some pores of the manufactured conductive fiber web, but the present invention is not limited thereto.

First, in step (1) according to the present invention, a conductive fiber web 120 is manufactured.

The conductive fiber web 120 may be manufactured by implementing a fiber web having a three-dimensional network structure using the manufactured conductive composite fiber 60 or may be manufactured through (a) spinning a spinning solution containing a fiber forming component to manufacture a fiber web formed of a fiber part and (b) forming a metal shell part to cover the outer surface of the fiber part to manufacture a conductive fiber web.

First, the former method will be described. The conductive composite fiber may be manufactured by spinning the spinning solution containing the fiber forming component through an inner nozzle of a double-spinning nozzle, extruding a metal paste capable of forming the metal shell part through an outer nozzle, and then sintering the metal paste.

Alternatively, the conductive composite fiber may be manufactured by forming the metal shell part on the outer surface of the fiber manufactured through the spinning solution containing the fiber forming component. In this case, when a solvent appropriately selected according to the spinning method, the type of the fiber forming component, and the like is additionally contained in the spinning solution, the spinning solution may be a dissolving solution in which the fiber forming component is dissolved or a melt solution in which the fiber forming component is melted. The method of spinning the spinning solution may be appropriately selected in consideration of the desired diameter of the conductive fiber, the desired type of the fiber forming component, and the like. As an example, the method may be a method of extruding the spinning solution through a spinneret using pressure or by electrospinning. Also, dry spinning or wet spinning may be appropriately selected in consideration of the type of the fiber forming component, the type of the solvent contained in the spinning solution, and the like. However, the present invention has no particular limitation thereon.

The method of forming the metal shell part on the outer surface of the manufactured fiber may be performed through known metal coating and plating methods. As an example, the fiber may be immersed in the metal paste and then subjected to a drying process and/or a sintering process. Alternatively, electroless plating may be performed as the known plating method.

A conductive fiber web may be manufactured by applying, to the manufactured conductive composite fiber, a well-known manufacturing method for a fiber web, for example, a dry non-woven fabric such as a chemical bonding non-woven fabric, a thermal bonding non-woven fabric, and an air-ray non-woven fabric, a wet non-woven fabric, a spunlace non-woven fabric, a needle punched non-woven fabric, or a melt blown non-woven fabric.

Next, the conductive fiber web may be manufactured by another manufacturing method including (a) spinning a spinning solution containing a fiber forming component to manufacture a fiber web formed of a fiber part and (b) forming a metal shell part to cover the outer surface of the fiber part to manufacture a conductive fiber web.

In step (a), the fiber web may be manufactured through a well-known spinning method. As an example, the fiber web may be manufactured by performing a calendering process on a fiber mat obtained by a collector collecting and accumulating the spun fiber forming component. Alternatively, the fiber web may be manufactured by performing the above-described well-known fiber web manufacturing method on separately manufactured fibers.

In step (b), the metal shell part is formed to cover the fiber part of the fiber web manufactured in step (a).

Subsequently, in step (b), which is a step of forming the metal shell part on the outer surface of the fiber part of the manufactured fiber web, the metal shell part may be formed by a well-known method. As an example, the well-known method may include deposition, plating, conductive paste coating, and the like for the metal shell part. However, it may be difficult for the deposition of the metal shell part to exhibit an electromagnetic wave shielding effect at a desired level because the metal shell part can be deposited on only the outer surface of the fiber part located on a surface portion of the fiber web and also may be difficult to provide in the fiber part located on a center portion of the fiber web. Also, pores on the surface portion of the fiber web on which the metal shell part is deposited may be closed. Thus, the elastic properties of the fiber web may be deteriorated, and also the deposited portion may be easily broken or delaminated during elongation or contraction. Also, when the fiber web is coated with a conductive paste, the fiber part located on the center portion and the surface portion of the fiber web may be uniformly coated. However, the deterioration of the elastic properties due to the closing of the pores may be remarkable, and thus the breakage and delamination of the metal shell part during elongation or contraction may be severe. Accordingly, it is preferable that the metal shell part may be formed on the fiber web through plating. More preferably, the plating may be electroless plating.

Next, in step (2) according to the present invention, the first conductive component is provided in at least some of the pores of the manufactured conductive fiber web.

The first conductive component may be provided in the pores provided in the conductive fiber web by appropriately modifying a well-known method of filling pores of a porous substrate. As an example, a well-known coating method such as application, immersion, screen printing, float printing, bar coating, or comma coating of a conductive solution containing the first conductive component may be used. Since the listed methods can be carried out by adopting conditions corresponding to the methods, a detailed description thereof will be omitted herein. The amount of the conductive solution provided inside the conductive fiber web may be adjusted by adjusting the viscosity of the conductive solution and the pore size and porosity of the conductive fiber web. Also, as an example, the conductive solution may be a metal paste containing metal particles, which is a conductive component, and a binder component may be contained in the metal paste. The binder component may be a polymer compound with elasticity and flexibility so as not to reduce the elasticity, flexibility, and the like of the conductive fiber web. As an example, the binder component may be a urethane-based compound.

Meanwhile, as shown in FIGS. 12A and 12B, in a flexible electromagnetic wave shielding material 1200' according to another embodiment of the present invention, a crack C may be formed in a metal shell part 62' of a conductive composite fiber 60' forming a conductive fiber web 120', and a second conductive component 310 provided in a gap of the crack C may be included. The second conductive component 10 may make electrical connection in the gap of the crack C, thus minimizing an increase in resistance due to the generation of the crack C.

The crack C is intentionally generated in the step of manufacturing the electromagnetic wave shielding material. By interposing the second conductive component 310 in the gap of the crack C and minimizing a decrease in resistance due to the crack C through a first conductive component 300' in contact with a portion having the crack C, starting from the commercialization stage, instead of improving the flexibility of the electromagnetic wave shielding material through the crack C and preventing the deterioration of physical properties due to the generation of the crack C after commercialization in advance, it is possible to satisfy desired initially-designed physical properties.

Any well-known material with electrical conductivity may be used as the second conductive component 310 without limitation. As an example, the electrically conductive material may include one or more materials among a conductive polymer compound and one or more types of metals selected from the group consisting of aluminum, nickel, copper, silver, gold, chromium, platinum, titanium alloys and stainless steel. As an example, the second conductive component 310 may be a sliver particle.

Also, the second conductive component 310 may be made of a different material from or the same material as the first conductive component 300'.

Also, the second conductive component 310 may have an average particle diameter adjusted in size so that the second conductive component 310 can be interposed in the gap of the crack. As an example, the particle diameter may range from 0.01 μm to 0.1 μm.

A method of manufacturing the above-described flexible electromagnetic wave shielding material in which the second conductive component 310 is interposed in the gap of the crack C as shown in FIGS. 12A and 12B will be described below. The flexible electromagnetic wave shielding material may be manufactured by forming a conductive fiber web, elongating the conductive fiber web in one or two axial directions to generate a crack in a metal shell part, and infiltrating and interposing the second conductive component 310 in the gap of the crack C while the conductive fiber web is elongated. Alternatively, the flexible electromagnetic wave shielding material may be manufactured by forming a conductive fiber web, applying a solution containing the second conductive component 310, i.e., a silver paste on the conductive fiber web, elongating the conductive fiber web in one or two axial directions to generate a crack in a metal shell part, and infiltrating the pre-treated sliver paste into a gap of the crack to interpose a sliver particle in the gap while the conductive fiber web is elongated.

In this case, the first conductive component may be provided in pores of the conductive fiber web through a separate process after the second conductive component is interposed in the gap of the crack, or the first conductive component may be contained in a solution used in the above-described process of treating the second conductive component so that the first conductive component can be provided in the pores of the conductive fiber web while the second conductive component is interposed in the gap of the crack of the metal shell part.

The conductive adhesive layers 200 and 200' may be further provided on at least one surfaces of the conductive fiber webs 120 and 120' implemented by the above-described manufacturing methods, as shown in FIG. 10. The description of the conductive adhesive layer in the first implementation may be applied to the conductive adhesive layers 200 and 200', and thus a detailed description thereof will be omitted.

Next, a fourth implementation of the present invention will be described.

Referring to FIG. 13, a flexible electromagnetic wave shielding material 1300 according to an embodiment of the fourth implementation of the present invention may include a conductive fiber web 130 formed of conductive composite fibers 70 and further include a conductive adhesive layer 200 provided on one or both surfaces of the conductive fiber web 130.

The conductive fiber web 130 has a three-dimensional network structure and includes multiple pores. The multiple pores may be formed by being surrounded by the conductive composite fibers 70, which are used as an example of forming the conductive fiber web 130. Also, the conductive fiber web 130 may have an air permeability of 0.01 cfm to 2 cfm. When the air permeability is less than 0.01 cfm and a conductive adhesive layer is formed on one surface of the conductive fiber web, it may be difficult to impregnate a conductive adhesive layer forming composition into the pores of the fiber web. When the air permeability exceeds 2 cfm, the mechanical properties and electromagnetic wave shielding performance of the conductive fiber web may be deteriorated.

Also, the conductive fiber web 130 may have a thickness of 5 μm to 200 μm and a basis weight of 5 g/m$^2$ to 100 g/m$^2$. When the thickness of the conductive fiber web exceeds 200 μm, it may not be easy to form a conductive part on an outer surface of a fiber part located at a center portion of the fiber web, and the elastic properties may be deteriorated. Also, when the thickness is less than 5 μm, the mechanical strength of the conductive fiber web may be deteriorated, the handling may become difficult, and the manufacturing may not be easy.

In order to satisfy an appropriate thickness, the conductive fiber web 130 may be formed as a single conductive fiber web or by stacking a plurality of conductive fiber webs. When the conductive fiber web 130 is formed by stacking the plurality of conductive fiber webs, a conductive adhesive layer for bonding the conductive fiber webs to one another may further be interposed therebetween. The subsequent description of the conductive adhesive layer 200 may be applied to the conductive adhesive layer, and thus a description thereof will be omitted.

Also, when the basis weight of the conductive fiber web 130 is less than 5 g/m$^2$, the mechanical strength of the conductive fiber web may be lowered, the handling may become difficult, and the manufacturing may not be easy. When the basis weight exceeds 100 g/m$^2$, it may not be easy to form the conductive part on the outer surface of the fiber part located at the center portion of the fiber web, and the elastic properties may be deteriorated.

The conductive composite fiber 70 is implemented to include a fiber part 71 provided with a crimp and a conductive part 72 covering an outer surface of the fiber part 71, as shown in FIG. 2.

The crimp formed in the fiber part 71 may be formed by a different method depending on the material and manufacturing method of the fiber part, and also may be adjustable in consideration of desired elasticity. Accordingly, the present invention has no particular imitation on the degree of formation of the crimp. However, preferably, the crimp may be formed on the fiber part such that the surface resistance value measured after the conductive fiber web 130 having the conductive part 72, which will be described later, is elongated by a factor of 1.2 in one axial direction and then the elongated force is removed varies in the range of 10% or less with respect to the surface resistance value before the elongation.

While a conductive part is provided in a fiber part of a typical fiber web, the elasticity of a conductive fiber web may be determined by factors such as the elongation/recovery force of the fiber part, and/or the elongation/recovery force of the conductive part, a structure in which the fiber part forms the web, and the like. Therefore, when the fiber part has good elasticity but the conductive part is made of a material with poor elasticity such as a metal, a crack or delamination may be generated in the conductive part due to elongation of the conductive fiber web in one axial direction, and thus the surface resistance value may increase. Unlike this, when the fiber part with poor elasticity and the conductive part with good elasticity are provided, the conductive fiber web may be damaged by tearing when the conductive fiber web is elongated in one axial direction, or the resistance may greatly increase due to yarn breakage of the conductive composite fiber even though the tearing is not visible with the naked eye. However, the conductive fiber web formed of the fiber part with the crimp formed therein according to the present invention has excellent elasticity due to the curled fiber part like a spring. Thus, the conductive fiber web can minimize the influence of the elastic properties or the like of the material of the fiber part and the material of the conductive part to significantly increase elasticity, flexibility, and the like and also can minimize or prevent damage or delamination of the conductive part even when the conductive fiber web is elongated. As a result, it is possible to prevent the deterioration of physical properties such as an increase in resistance over an initially designed resistance value. Accordingly, when the conductive fiber web according to an embodiment of the present invention is elongated in one axial direction by a factor of 1.2 with respect to a length in the axial direction and then resistance is measured while the elongation force is removed, the measured surface resistance value may vary in the range of 10% or less with respect to the surface resistance value before the elongation. Therefore, it is possible to minimize or prevent a variation in physical properties despite elongation or contraction. When the resistance in the recovered state after the elongation is increased by more than 10% in comparison with the resistance before the elongation, the resistance value may be remarkably increased due to delamination or damage of the conductive part in comparison with initial designs when the fiber web is attached to a target surface on which a stepped portion is formed, and also the conductive shielding material may be damaged by tearing or the like.

A fiber forming component for implementing the fiber part 71 is an entity that forms a fiber or a fiber web in a conductive composite fiber or a conductive fiber web. The fiber forming component allows exhibition of elasticity, flexibility, and creasing/recovery of the fiber web. Any well-known polymer compound that may be typically formed in a fibrous shape may be used as the fiber forming component without limitation. As an example, the fiber forming component may be obtained by blending and then spinning PVDF, which is a fluorine-based compound, and polyurethane in a spinning solution in order for the conductive fiber web 130 to exhibit enhanced elasticity, flexibility, heat resistance, chemical resistance, and mechanical strength. In this case, the PVDF and the polyurethane may be contained at a weight ratio of 1:0.2 to 1:2 and preferably 1:0.4 to 1:1.5. When the weight of the polyurethane is less than 0.2 times the weight of the PVDF, the flexibility, elasticity, and the like may be deteriorated. As a result, when the conductive fiber web is provided on a substrate having a stepped portion and a change in shape during use, the conductive fiber web may be torn or difficult to bring into contact with the stepped portion, and also electromagnetic wave shielding performance may be more deteriorated than initially designed, due to damage to the conductive fiber web. Also, when the weight of the polyurethane is more than two times the weight of the PVDF, a recovery force is lowered due to elongation or contraction, and thus a permanent shape change may be induced due to a failure to recover its original state before elongation or contraction. As a result, the deterioration of the electromagnetic wave shielding performance may be induced because a separation distance of a crack generated due to the permanent shape change cannot be reduced. Also, the chemical resistance may be significantly deteriorated, and thus the fiber part may be damaged while the metal shell part is being formed. Accordingly, the deterioration of the mechanical properties, such as yarn breakage of the fiber part or tearing of the fiber web, may occur due to the shape change such as the elongation/contraction, creasing, and the like of the conductive fiber web.

Meanwhile, when the fiber part forms a crimp according to different shrinkage characteristics, the fiber part may be formed by placing, as the fiber forming component, two components with different elastic properties in the section of the fiber such that the components are not blended with each other. In this case, the two components may be heterogeneous components with different elasticity properties or homogeneous components with different viscosities.

Also, the conductive part 72 functions to lower the resistance of the conductive fiber web to exhibit the electromagnetic wave shielding performance. Any typical material with electrical conductivity may be used as the conductive part 72 without limitation. As an example, the conductive part 72 may be made of one or more types of metals selected from the group consisting of aluminum, nickel, copper, silver, gold, chromium, platinum, titanium alloys, and stainless steel. Also, the conductive part 72 may be a conductive polymer compound. Also, any well-known polymer compound with electrical conductivity may be used as the conductive polymer compound without limitation. The description of the conductive polymer compound in the first implementation may be applied to the specific types of the conductive polymer compound, and thus a description thereof will be omitted.

However, the conductive part 72 may be made of a metal in order to exhibit the electromagnetic wave shielding performance at a desired level. Also, preferably, the conductive part may be formed of three layers consisting of a nickel layer, a copper layer, and a nickel layer. In this case, the copper layer allows the conductive fiber web to have low electrical resistance, thereby exhibiting excellent electromagnetic wave shielding performance, minimizing a crack in the metal shell part even during shape change, such as creasing and elongation/contraction, of the conductive fiber web, and also improving the elastic properties. Also, the nickel layer formed on the copper layer can prevent oxidation of the copper layer, thereby preventing deterioration of the electromagnetic wave shielding performance. To this end, more preferably, the nickel layer in contact with the fiber part may be formed at a thickness of 0.02 µm to 0.2 µm, the copper layer formed thereon may be formed at a thickness of 0.08 µm to 1.8 µm, and the nickel layer formed on the outermost layer may be formed at a thickness of 0.02 µm to 0.2 µm. When the thickness of each layer is out of the above range, the effect of each layer may be exhibited insignificantly or not at all. The desired physical properties of the present invention may be insignificantly exhibited.

Also, the conductive part may have a thickness of 0.1 µm to 2 µm. When the thickness of the conductive part exceeds 2 µm, a crack and a delamination may be easily generated while the shape change is made due to bending of the conductive composite fiber 70. When the material of the conductive part is a conductive polymer compound, it may be difficult to decrease electrical resistance because of an increase in thickness. Also, the increased thickness of the conductive part changes a pore diameter structure of the conductive fiber web, and thus it may be difficult to achieve a desired level of elasticity, flexibility, and the like. Also, when the thickness is less than 0.1 µm, it is not easy to form the conductive part to a small thickness, and also a crack or delamination is very easily generated. Thus, it may be difficult to exhibit electromagnetic wave shielding performance at a desired level during elongation or contraction.

Also, the conductive composite fiber 70 may have a diameter of 0.2 μm to 10 μm. When the diameter is less than 0.2 μm, the handling properties may be deteriorated, and the manufacturing may not be easy. When the diameter exceeds 10 μm, the elasticity may be deteriorated, and then the electromagnetic wave shielding performance may be deteriorated.

A conductive adhesive layer 200 may be additionally provided on at least one surface of the conductive fiber web 130 formed to contain the above-described conductive composite fiber 70, as shown in FIG. 13. The description of the conductive adhesive layer in the first implementation may be applied to the conductive adhesive layer 200, and thus a detailed description thereof will be omitted.

The electromagnetic wave shielding material 1300 according to an embodiment of the present invention may be manufactured by implementing a fiber web having a three-dimensional network structure using a conductive composite fiber 70 provided with a crimp in order to manufacture a conductive fiber web or may be manufactured through (a) spinning a spinning solution containing a fiber forming component to manufacture a fiber web through a fiber part provided with a crimp and (b) forming a conductive part to cover the outer surface of the fiber part to manufacture a conductive fiber web.

The former method will be described first. The method is a method of manufacturing a conductive composite fiber first and then implementing a conductive fiber web through the manufactured conductive composite fiber. The conductive composite fiber may be manufactured by a method of manufacturing a fiber part provided with a crimp and then forming a conductive part on the outer surface of the fiber part and by a method of forming a fiber part and a conductive part at the same time.

First, the method of manufacturing the first part provided with the crimp and then forming the conductive part will be described first. The fiber part provided with the crimp may be manufactured through a well-known crimp fiber manufacturing method. In detail, as a method of extruding a molten spinning solution to provide the spun fiber part with the crimp, a method of providing the fiber part with the crimp using different shrinkage properties of a two-component polymer and a method of providing the fiber part with the crimp through physical twisting and heat setting may be considered. As an example, the method of providing the fiber part with the crimp using the different shrinkage properties of the two-component polymer may include spinning polyethylene terephthalate with an intrinsic viscosity of 0.6 dl/g to 0.8 dl/g as a first component and polyethylene terephthalate with an intrinsic viscosity of 0.4 dl/g to 0.55 dl/g as a second component in combination such that the two types of components are appropriately arranged half and half in a side-by-side, 8-shaped, or circular section of the spun fiber part. In this case, a drawn yarn may be manufactured through high-speed spinning during spinning or through a separate drawing process after spinning. The fiber manufactured in this way is a latent crimp yarn in which a crimp is not yet exhibited. The crimp may be exhibited through separate heat treatment before the conductive part is formed or may be simultaneously exhibited through heat applied to form the conductive part.

Also, as the method of providing the fiber part with the crimp through physical twisting and heat setting, a well-known method, such as a twisting-heat setting-de-twisting method, a twisting method, a knife-edge method, a stuffing method, a high-pressure air jet method, a composite crimp method, and an opening and mixing method may be appropriately employed, and also well-known conditions corresponding to the selected method may be used. Therefore, a detailed description thereof will be omitted herein.

Also, when the fiber part is manufactured by electrospinning, the spinning may be made to form a crimp on the spun fiber by changing the spinning conditions. As an example, there are a method of inducing fast integration by increasing the weight and diameter of a fiber to form a crimp and a method of shortening a fiber flight time during integration, and the like. To this end, the spinning conditions may be changed by increasing the parts by weight of the fiber forming component when a spinning solution is manufactured or by decreasing a distance between a nozzle and an integrated board. Accordingly, the spinning is differently made unlike typical electrospinning, and thus the fiber may be provided with the crimp.

A conductive part may be formed on the fiber part implemented by the above-described method. The conductive part may be performed through well-known coating and plating methods for covering the outer surface of the manufactured fiber with a metal or a polymer compound. As an example, when the conductive part is made of a metal, the fiber may be immersed in a metal paste and then subjected to a drying process and/or a sintering process to form the conductive part. Alternatively, as the known plating method, electroless plating may be performed to form the conductive part.

Next, the method of forming the fiber part and the conductive part at the same time in order to manufacture the conductive composite fiber may include spinning a spinning solution containing a fiber forming component through an inner nozzle of a double-spinning nozzle, extruding a metal paste capable of forming the conductive part through an outer nozzle, and then sintering the metal paste.

In this case, as an example for providing the fiber part with the crimp, when the fiber part provided with the crimp is manufactured through electrospinning, a spun nanoscale fiber part may be provided with a twisted crimp by appropriately adjusting a discharge speed of the spinning solution spun from the inner nozzle, an applied voltage, and/or a humidity in an air gap during the electrospinning. In this case, the detailed conditions for applying the crimp may be changed according to the degree of crimp to be provided to the nanofiber part. The present invention has no particular limitation thereon.

A conductive fiber web may be manufactured by applying, to the conductive composite fiber manufactured by the above-described method, a well-known manufacturing method for a fiber web, for example, a dry non-woven fabric such as a chemical bonding non-woven fabric, a thermal bonding non-woven fabric, and an air-ray non-woven fabric, a wet non-woven fabric, a spunlace non-woven fabric, a needle punched non-woven fabric, or a melt blown non-woven fabric.

Alternatively, unlike the above-described former method, the latter method may include (a) spinning a spinning solution containing a fiber forming component to manufacture a fiber web formed of a fiber part provided with a crimp and (b) forming a conductive part to cover the outer surface of the fiber part to manufacture a conductive fiber web.

In step (a), according to the above-described conductive composite fiber manufacturing method, the fiber part provided with the crimp may be manufactured through the method of manufacturing the fiber part provided with the crimp, and then the fiber web may be manufactured. In detail, as an example of manufacturing the fiber web, the fiber web may be manufactured by spinning a fiber forming component and performing a calendering process on a fiber mat obtained by a collector collecting and accumulating the fiber forming component or may be manufactured by a well-known fiber web manufacturing method on fibers provided with separately manufactured crimps.

Subsequently, in step (b), the conductive part is formed to cover the fiber part of the fiber web manufactured in step (a). In step (b), which is a step of forming the conductive part on the outer surface of the fiber part of the fiber web, the conductive part may be formed by a well-known method. As an example, the well-known method may include deposition, plating, conductive paste coating, and the like for the conductive part. However, it may be difficult for the deposition of the conductive part to exhibit an electromagnetic wave shielding effect at a desired level because the conductive part can be deposited on only the outer surface of the fiber part located on a surface portion of the fiber web and also may be difficult to provide in the fiber part located on a center portion of the fiber web. Also, pores on the surface portion of the fiber web on which the conductive part is deposited may be closed. Thus, the elastic properties of the fiber web may be deteriorated, and also the deposited portion may be easily broken or delaminated during elongation or contraction.

Also, when the fiber web is coated with a conductive paste, the fiber part located on the center portion and the surface portion of the fiber web may be uniformly coated. However, the deterioration of the elastic properties due to the closing of the pores may be remarkable, and thus the breakage and delamination of the conductive part during elongation or contraction may be severe. Accordingly, it is preferable that the conductive part may be formed on the fiber web through plating. More preferably, the plating may be electroless plating.

Next, in step (2) according to the present invention, a conductive adhesive layer is formed on at least a partial surface of the manufactured conductive fiber web. The conductive adhesive layer may be formed by treating a conductive adhesive composition in which a resin component forming a matrix of the above-described conductive adhesive layer, a conductive filler, a solvent, and additives such as a dispersant and a flame retardant are mixed with each other on at least one surface of the manufactured conductive fiber web. As the method of treating the conductive adhesive composition, a well-known method such as application, screen printing, float printing, or comma coating of a conductive adhesive composition may be used. Since the listed methods can be carried out by adopting conditions corresponding to the methods, a detailed description thereof will be omitted herein. In this case, by adjusting the viscosity of the conductive adhesive composition and the pore size and porosity of the conductive fiber web, the conductive adhesive composition may be adjusted not to infiltrate into the conductive fiber web or adjusted to be impregnated into the conductive fiber web.

The electromagnetic wave shielding materials 1000, 1100, 1200, and 1300 according to the above-described various implementations may be implemented in an electromagnetic wave shielding-type circuit module 2000 as shown in FIG. 15. In detail, an electromagnetic wave shielding material 2100 may be provided on an upper portion of a circuit board 2200 where elements 2310 and 2320 are mounted to cover at least an upper portion and a lateral portion of the elements 2310 and 2320.

The circuit board 2200 may be a well-known circuit board provided in an electronic device. As an example, the circuit board 2200 may be a printed circuit board (PCB), a flexible printed circuit board (FPCB), or the like. The size and thickness of the circuit board 2200 may be changed depending on an internal design of an electronic device to be implemented. Therefore, the present invention has no particular limitation thereto.

Also, the elements 2310 and 2320 may be well-known elements mounted on a circuit board in an electronic device such as a driving chip and may be devices that easily malfunction since the devices generate electromagnetic waves and/or heat or are sensitive to electromagnetic waves.

The electromagnetic wave shielding material 2100 according to an embodiment of the present invention may be attached in close contact with the lateral portion of the elements 2310 and 2320 even when a separation distance between the adjacent elements 2310 and 2320 is small or even when there is a stepped portion due to the thicknesses of the elements 2310 and 2320. Therefore, the electromagnetic wave shielding material 2100 is advantageous for exhibiting enhanced electromagnetic wave shielding performance.

MODE OF THE INVENTION

The present invention will be described in detail with reference to the following embodiments. However, the following embodiments should not be construed as limiting the scope of the present invention, but should be construed as facilitating an understanding of the present invention.

Embodiment 1

A spinning solution was manufactured by dissolving 12 g of polyvinylidene fluoride in 88 g of dimethylacetamide and acetone, which were mixed at a weight ratio of 70:30, using a magnetic bar at a temperature of 80° C. for 6 hours. Spherical silver particles having an average particle diameter of 1.3 μm were mixed with the spinning solution as conductive fillers such that the polyvinylidene fluoride and the sliver particles had a volume ratio of 1:0.2 and the sliver particles occupied 16.7% of the total volume of the final fiber part, and then were dispersed using an ultrasonic disperser for 12 hours. The spinning solution was poured into a solution tank of an electrospinning apparatus, stirred through an impeller, and then discharged at a rate of 20 μL/min/hole. In this case, a fiber web formed of an Ag/PVDF composite fiber in which a second part with no silver particles had an average diameter of 300 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator, and also applying an air pressure of 0.05 MPa per spin pack nozzle. Next, a calendering process was carried out on the fiber web by applying heat and pressure at 140° C. and 1 kgf/cm$^2$ in order to dry the remaining solvent and moisture.

Next, a metal shell part, which was made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution ($H_2SO_4$ 85 ml/L, pure water) for catalytic activity at 50° C. for 30 seconds, cleaned with pure water, immersed in a nickel ion solution at 60° C. for 1 minute, and then cleaned with pure water. Thus, the fiber part of the fiber web was covered with a metal shell part made of nickel with a thickness of 0.12 μm. As a result, a conductive fiber web having a thickness of 10 μm, a basis weight of 12 g/m², and a porosity of 40% was manufactured as shown in Table 1 below.

Embodiments 2 to 11

A conductive fiber web as shown in Table 1 was manufactured in the same way as in Embodiment 1, except that the amount and particle diameter of the conductive fillers were changed as shown in Table 1 or Table 2 below.

Comparative Example 1

A conductive fiber web as shown in Table 2 below was manufactured in the same way as in Embodiment 1, except that the conductive fillers were not contained.

Experimental Example 1

The following physical properties of the conductive fiber webs according to Embodiments 1 to 11 and Comparative Example 1 were measured and shown in Table 1 and Table 2 below.

1. Initial Electromagnetic Wave Shielding Performance

The surface resistance of the conductive fiber web was measured through a resistance meter (HIOKI 3540 mΩ HITESTER, HIOKI). The measured resistance value according to the embodiment was expressed by a relative percentage with respect to the measured resistance value of Comparative Example 1 being set to 100.

2. Electromagnetic Wave Shielding Performance Variation

A specimen was elongated by a factor of 1.2 in the transverse direction and then by a factor of 1.2 in the longitudinal direction by means of a jig. This process was repeated three times.

Subsequently, a resistance value B for each specimen after elongation was found using the method of measuring the initial electromagnetic wave shielding performance, and a variation of each specimen according to elongation with respect to an initial resistance value A of each specimen was calculated using Equation 1 below.

In this case, the variation being increased means that the electromagnetic wave shielding performance is deteriorated.

$$\text{Variation (\%)} = (B-A) \times 100 \div A \quad \text{[Equation 1]}$$

3. Shape Retention

After the process was performed three times during the electromagnetic wave shielding performance variation measuring process, whether damage such as tearing had occurred was evaluated by checking the surface of the specimen by the naked eye. The case in which the damage had occurred was evaluated as ○, and the case in which the damage had not occurred was evaluated as x.

TABLE 1

|  |  | Embodiment 1 | Embodiment 2 | Embodiment 3 | Embodiment 4 | Embodiment 5 | Embodiment 6 |
|---|---|---|---|---|---|---|---|
| Conductive Fillers | Particle Diameter (μm) | 1.3 | 1.45 | 1.6 | 0.25 | 0.35 | 0.75 |
|  | Content (Volume %) | 16.7 | 16.7 | 16.7 | 16.7 | 16.7 | 16.7 |
| Diameter of Second Part (nm) |  | 300 | 300 | 300 | 300 | 300 | 300 |
| Diameter of Second Part: Diameter of Conductive Fillers |  | 1:4.33 | 1:4.83 | 1:5.33 | 1:0.83 | 1:1.17 | 1:2.5 |
| Initial Electromagnetic Wave Shielding Performance (%) |  | 89.6 | 87.4 | 86.7 | 99.1 | 94.2 | 92.1 |
| Electromagnetic Wave Shielding Performance Variation (%) |  | 10.7 | 11.1 | 23.8 | 26.6 | 18.5 | 14.9 |
| Shape Retention |  | x | x | ○ | x | x | x |

TABLE 2

|  |  | Embodiment 7 | Embodiment 8 | Embodiment 9 | Embodiment 10 | Embodiment 11 | Comparative Example 1 |
|---|---|---|---|---|---|---|---|
| Conductive Fillers | Particle Diameter (μm) | 1 | 1.3 | 1.3 | 1.3 | 1.3 | — |
|  | Content (Volume %) | 16.7 | 8.5 | 10.5 | 49 | 52 | 0 |
| Diameter of Second Part (nm) |  | 300 | 300 | 300 | 300 | 300 | 300 |
| Diameter of Second Part: Diameter of Conductive Fillers |  | 1:3.33 | 1:4.33 | 1:4.33 | 1:4.33 | 1:4.33 | — |
| Initial Electromagnetic Wave Shielding Performance (%) |  | 90.5 | 98.5 | 93.2 | 79.4 | 78.1 | 100 |

TABLE 2-continued

|  | Embodiment 7 | Embodiment 8 | Embodiment 9 | Embodiment 10 | Embodiment 11 | Comparative Example 1 |
|---|---|---|---|---|---|---|
| Electromagnetic Wave Shielding Performance Variation (%) | 12.0 | 14.4 | 11.6 | 16.6 | 26.9 | 41.1 |
| Shape Retention | x | x | x | x | o | x |

As can be seen from Table 1 and Table 2, the resistance was more rapidly increased after the elongation of the electromagnetic wave shielding material in Comparative Example 1, in which no conductive filler was provided, than in the embodiments.

However, it can be seen that tearing caused by elongation occurred due to the lowering of the mechanical strength and thus the variation was also high in Embodiment 3, in which the particle diameter of the conductive fillers was out of the preferable range of the present invention, or Embodiment 11, in which the content was out of the preferable range of the present invention among the embodiments.

Embodiment 12

A conductive fiber web was manufactured in the same way as in Embodiment 1, except that the fiber forming component and the solvent of the spinning solution were changed. In detail, a spinning solution was manufactured by dissolving 16 g of a fiber forming component obtained by mixing polyvinylidene fluoride (PVDF) and polyurethane at a weight ratio of 7:3 in 84 g of a solvent obtained by mixing dimethylacetamide and acetone at a weight ratio of 7:3 using a magnetic bar at a temperature of 60° C. for 6 hours. Thus, a conductive fiber web having a thickness of 10 μm, a basis weight of 11.6 g/m², and a porosity of 38% was manufactured as shown in Table 3 below.

1. Electromagnetic Wave Shielding Performance Variation

A specimen was elongated by a factor of 1.4 in the transverse direction and then by a factor of 1.4 in the longitudinal direction by means of a jig while a stress was removed. This process was repeated three times.

Subsequently, the variation was calculated using Equation 1 in the same way as the evaluation method in Experimental Example 1. In this case, the variation being increased means that the electromagnetic wave shielding performance is deteriorated.

2. Shape Retention

In order to evaluate the retention of the electromagnetic wave shielding performance, the area C of a specimen was calculated after the transverse and longitudinal elongation/contraction processes and a recovery process were repeated three times. An area variation was calculated using Equation 2 below with respect to the initial area D of the specimen before the specimen was subjected to the elongation/contraction process. Also, the case in which damage such as tearing had occurred after the elongation/contraction process and the recovery process were repeated three times was marked with o and the case in which the damage had not occurred was marked with x. In this case, the area variation was not calculated on the specimen with damage such as tearing.

$$\text{Area Variation (\%)} = (C-D) \times 100 \div D \quad [\text{Equation 2}]$$

Also, the area variation being increased means that a recovery force is not good after elongation.

TABLE 3

| | | Embodiment 1 | Embodiment 12 | Embodiment 13 | Embodiment 14 | Embodiment 15 | Embodiment 16 | Embodiment 17 | Embodiment 18 |
|---|---|---|---|---|---|---|---|---|---|
| Fiber Forming Component | Weight Ratio of PVDF: polyurethane | 1:0.0 | 1:0.43 | 1:1.45 | 1:1.6 | 1:1.9 | 1:2.2 | 1:0.14 | 1:0.22 |
| Electromagnetic Wave Shielding Performance Variation (%) | | 26.9 | 6.9 | 8.2 | 11.6 | 12.8 | 16.7 | 15.1 | 10.3 |
| Shape Retention | Presence of Damage | o | x | x | x | x | o | o | x |
| | Area Variation (%) | N/A | 3.2 | 6.4 | 6.8 | 7.5 | N/A | N/A | 2.1 |

Embodiments 13 to 18

A conductive fiber web as shown in Table 3 was manufactured in the same way as in Embodiment 12, except that the content ratio between the PVDF and the polyurethane, which were contained in the fiber forming component, was changed as shown in Table 3 below.

Experimental Example 2

The following physical properties were evaluated on Embodiments 1 and 12 to 18 and shown in Table 3 below.

As can be seen from Table 3, as an elongation rate further increased in Embodiment 1, in which polyurethane was not contained as the fiber forming component of the fiber part, than in Experimental Example 1, tearing occurred and also the electromagnetic wave shielding performance variation increased significantly.

Also, it can be seen that tearing occurred in Embodiment 17, in which polyurethane was contained but too little, or in Embodiment 16, in which polyurethane was excessively contained, and thus the electromagnetic wave shielding performance variation increased significantly.

Meanwhile, the tearing having occurred in Embodiment 16 despite an increase in amount of the polyurethane might be expected to be due to a result caused by the damage to the fiber part according to various solutions applied during a plating process.

Embodiment 19

A spinning solution was manufactured by dissolving 12 g of polyvinylidene fluoride in 88 g of dimethylacetamide and acetone, which were mixed at a weight ratio of 70:30, using a magnetic bar at a temperature of 80° C. for 6 hours. The spinning solution was poured into a solution tank of an electrospinning apparatus and then discharged at a rate of 20 μL/min/hole. In this case, a PVDF fiber web with an average diameter of 200 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator on the collector, and also applying an air pressure of 0.01 MPa per spin pack nozzle. Next, a calendering process was carried out on the fiber web by applying heat and pressure at 140° C. and 1 kgf/cm² in order to dry the remaining solvent and moisture.

Subsequently, a first conductive part, which was made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution ($H_2SO_4$ 85 ml/L, pure water) for catalytic activity at 50° C. for 30 seconds, cleaned with pure water, immersed in a nickel ion solution at 60° C. for 1 minute, and then cleaned with pure water. Thus, the fiber part of the fiber web was covered with the first conductive part made of nickel with a thickness of 0.12 μm.

Subsequently, by elongating the fiber web in which the first conductive part made of nickel was formed on the fiber part by a factor of 1.2 in one direction by means of a jig, a crack was generated in the first conductive part, and the fiber web was fixed to a frame while being elongated. Subsequently, in order to form a second conductive part, a second conductive part forming solution was manufactured. In detail, in order to improve the volatility of a dispersion solution obtained by mixing 1 to 1.5 parts by weight of PEDOT with 100 parts by weight of ultrapure water, 50 parts by weight of IPA was mixed with 100 parts by weight of the dispersion solution, and the mixture was stirred at room temperature for 6 hours. The fiber web fixed to the frame was spray-coated with the manufactured second conductive part forming solution and then was dried in a vacuum oven at 60° C. Thus, the fiber web was covered with the second conductive part having a thickness of 0.06 μm. As a result, a conductive fiber web having a thickness of 20 μm, a basis weight of 11.5 g/m², and a porosity of 30% was manufactured as shown in Table 4 below. Through an SEM photograph captured on the manufactured conductive fiber web, it can be seen that the second conductive part filled a gap of the crack generated in the first conductive part.

Embodiments 20 to 26

A conductive fiber web as shown in Table 4 was manufactured in the same way as in Embodiment 19, except that the diameter of the nanofiber, the thickness of the first conductive part, and/or the thickness of the second conductive part were changed as shown in Table 4 below.

Comparative Example 2

A conductive fiber web as shown in Table 4 below was manufactured in the same way as in Embodiment 19, except that only the first conductive part was formed.

Comparative Example 3

A conductive fiber web as shown in Table 4 below was manufactured in the same way as in Embodiment 19, except that only the second conductive part was formed to a thickness of 2 μm instead of the first conductive part.

Experimental Example 3

According to Experimental Example 1 that was described above, initial electromagnetic wave shielding performance, electromagnetic wave shielding performance variation, and shape retention were evaluated on the electromagnetic wave shielding materials according to Embodiments 19 to 26 and Comparative Examples 2 and 3 and then were shown in Table 4. In this case, for the initial electromagnetic wave shielding performance, the resistance values measured according to Embodiments 19 to 24 and Comparative Example 3 were shown relative to the measured resistance value of Comparative Example 2 set to 100.

TABLE 4

| | Embodiment 19 | Embodiment 20 | Embodiment 21 | Embodiment 22 | Embodiment 23 | Embodiment 24 | Embodiment 25 | Embodiment 26 | Comparative Example 2 | Comparative Example 3 |
|---|---|---|---|---|---|---|---|---|---|---|
| Diameter of Nanofiber (nm) | 200 | 200 | 800 | 1500 | 1500 | 800 | 800 | 200 | 200 | 200 |
| Thickness of First Conductive Part (μm) | 0.12 | 0.07 | 1.0 | 1.9 | 2.2 | 1.5 | 1.5 | 0.12 | 0.12 | 0 |
| Thickness of Second Conductive Part (μm) | 0.06 | 0.06 | 0.05 | 0.09 | 0.09 | 0.95 | 1.2 | 0.02 | 0 | 1.0 |

TABLE 4-continued

|  | Embodiment 19 | Embodiment 20 | Embodiment 21 | Embodiment 22 | Embodiment 23 | Embodiment 24 | Embodiment 25 | Embodiment 26 | Comparative Example 2 | Comparative Example 3 |
|---|---|---|---|---|---|---|---|---|---|---|
| Initial Electromagnetic Wave Shielding Performance (%) | 103.5 | 109.1 | 81.7 | 76.4 | 74.3 | 78.5 | 84.8 | 106.2 | 100 | 115.8 |
| Electromagnetic Wave Shielding Performance Variation (%) | 12.8 | 16.5 | 9.6 | 11.5 | 15.1 | 12.4 | 26.8 | 16.0 | 41.1 | 0.6 |
| Shape Retention | x | x | x | x | x | x | ○ | x | x | x |

As can be seen from Table 4 above, the electromagnetic wave shielding performance variation was remarkable in Comparative Example 2, in which only the first conductive part made of a metal was formed, compared to the embodiments. Also, it can be seen that the initial electromagnetic wave shielding performance was significantly poor in Comparative Example 3, in which only the second conductive part was formed, compared to the embodiments.

Also, among the embodiments, the initial electromagnetic wave shielding performance was deteriorated in Embodiment 20, in which the first conductive part was too thin, compared to Embodiment 19. This was expected to be due to the first conductive part delaminated during the elongation process before the second conductive part was formed.

It can also be seen that the electromagnetic wave shielding performance variation was larger in Embodiment 23, in which the first conductive part was too thick, than in Embodiment 22.

Also, the initial electromagnetic wave shielding performance was deteriorated in Embodiment 26, in which the second conductive part was too thin, compared to Embodiment 19. This was expected to be due to the second conductive part insignificantly filling, and thus providing electrical connection to, the gap of the generated crack. Also, it can be seen that in Embodiment 25, in which the second conductive part was excessively formed, tearing occurred after elongation and recovery was repeated three times and thus the variation in the electromagnetic wave shielding performance was large.

Embodiment 27

A conductive fiber web was manufactured in the same way as in Embodiment 19, except that the fiber forming component and the solvent of the spinning solution were changed. In detail, a spinning solution was manufactured by dissolving 16 g of a fiber forming component obtained by mixing polyvinylidene fluoride and polyurethane at a weight ratio of 7:3 in 84 g of a solvent obtained by mixing dimethylacetamide and acetone at a weight ratio of 7:3 using a magnetic bar at a temperature of 60° C. for 6 hours. Thus, a conductive fiber web having a thickness of 20 μm, a basis weight of 11.1 g/m$^2$, and a porosity of 30% was manufactured as shown in Table 5 below.

Embodiments 28 to 33

A conductive fiber web as shown in Table 5 below was manufactured in the same way as in Embodiment 27, except that the content ratio between the PVDF and the polyurethane, which were contained in the fiber forming component, was changed as shown in Table 5 below.

Experimental Example 4

The following physical properties were evaluated on Embodiments 19 and 27 to 33 by evaluating the electromagnetic wave shielding performance variation and the shape retention in the same way as in Experimental Example 2 and then were shown in Table 5 below.

Table 5

|  |  | Embodiment 19 | Embodiment 27 | Embodiment 28 | Embodiment 29 | Embodiment 30 | Embodiment 31 | Embodiment 32 | Embodiment 33 |
|---|---|---|---|---|---|---|---|---|---|
| Fiber Forming Component | Weight Ratio of PVDF: polyurethane | 1:0.0 | 1:0.43 | 1:1.45 | 1:1.6 | 1:1.9 | 1:2.2 | 1:0.14 | 1:0.22 |
|  | Electromagnetic Wave Shielding Performance Variation (%) | 23.9 | 4.8 | 4.0 | 7.5 | 8.7 | 12.7 | 11.1 | 6.4 |
| Shape Retention | Presence of Damage | ○ | x | x | x | x | ○ | ○ | x |
|  | Area Variation (%) | N/A | 3.0 | 5.8 | 6.4 | 6.9 | N/A | N/A | 2.2 |

As can be seen from Table 5, as an elongation rate further increased in Embodiment 19, in which polyurethane was not included as the fiber forming component of the fiber part, than in Experimental Example 1, tearing occurred and also the electromagnetic wave shielding performance variation increased significantly.

Also, it can be seen that tearing occurred in Embodiment 32, in which polyurethane was contained but too little, or in Embodiment 31, in which polyurethane was excessively contained, and thus the electromagnetic wave shielding performance variation increased significantly.

Meanwhile, the tearing having occurred in Embodiment 31 despite an increase in amount of the polyurethane might be expected to be due to a result caused by the damage to the fiber part according to various solutions applied during a plating process.

Embodiment 33

A spinning solution was manufactured by dissolving 12 g of polyvinylidene fluoride in 85 g of dimethylacetamide and acetone, which were mixed at a weight ratio of 70:30, using a magnetic bar at a temperature of 80° C. for 6 hours. The spinning solution was poured into a solution tank of an electrospinning apparatus and then discharged at a rate of 20 μL/min/hole. In this case, a PVDF fiber web with an average diameter of 400 nm was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator on the collector, and also applying an air pressure of 0.03 MPa per spin pack nozzle. Next, a calendering process was carried out on the fiber web by applying heat and pressure at 140° C. and 1 kgf/cm$^2$ in order to dry the remaining solvent and moisture.

Next, a metal shell part, which was made of nickel, was formed in the manufactured fiber web. In detail, nickel electroless plating was carried out on the fiber web. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution (H$_2$SO$_4$ 85 ml/L, pure water) for catalytic activity at 50° C. for 30 seconds, cleaned with pure water, immersed in a nickel ion solution at 60° C. for 1 minute 30 seconds, and then cleaned with pure water. Thus, the fiber part of the fiber web was covered with a metal shell part made of nickel with a thickness of 0.2 μm. As a result, a conductive fiber web having a thickness of 20 μm, a basis weight of 10 g/m$^2$, a porosity of 50%, and an average pore diameter of 0.7 μm was manufactured.

Subsequently, as the first conductive component, a sliver paste containing silver particles having an average particle diameter of 0.58 μm, 92% of which have particle diameters in the range of 0.56 μm to 0.66 μm, was infiltrated into the pores of the conductive fiber web using a bar coater, and a portion of the silver paste not infiltrated was removed. Then, the conductive fiber web was dried in a vacuum oven at a temperature of 60° C. As a result, an electromagnetic wave shielding material was manufactured as shown in Table 6.

Embodiments 34 to 36

An electromagnetic wave shielding material as shown in Table 6 below was manufactured in the same way as in Embodiment 33, except that the particle diameter of the first conductive component was changed as shown in Table 6 below.

Embodiment 37

An electromagnetic wave shielding material was manufactured in the same way as in Embodiment 33, except that as the second conductive component, a silver paste containing silver particles having an average particle diameter of 0.05 μm was treated on the conductive fiber web using a bar coater and then the conductive fiber web was elongated in one axial direction by a factor of 1.2 to generate a crack in the metal shell part of the conductive composite fiber. In this case, by maintaining the elongation for two hours, the second conductive component was infiltrated into a gap of the metal shell part with the crack, a portion of the sliver paste not infiltrated was removed, and then the conductive fiber web was dried in a vacuum oven at 60° C. Subsequently, the silver paste containing the first conductive component according to Embodiment 1 was treated and dried. As a result, an electromagnetic wave shielding material was manufactured as shown in Table 6 below.

Comparative Example 4

An electromagnetic wave shielding material was manufactured in the same way as in Embodiment 33, except that a process of providing a first conductive component in pores was not performed. The manufactured conductive fiber web was used as the electromagnetic wave shielding material.

Experimental Example 5

Like Experimental Example 1 that was described above, initial electromagnetic wave shielding performance and electromagnetic wave shielding performance variations were evaluated on the electromagnetic wave shielding materials according to Embodiments 33 to 37 and Comparative Examples 4 and then were shown in Table 6 below. In this case, the measured resistance value according to the embodiment was expressed by a relative percentage with respect to the measured resistance value of Comparative Example 4 being set to 100.

TABLE 6

| | | Embodiment 33 | Embodiment 34 | Embodiment 35 | Embodiment 36 | Embodiment 37 | Comparative Example 4 |
|---|---|---|---|---|---|---|---|
| Average Pore Diameter of Pore (μm) | | 0.7 | 0.7 | 0.7 | 0.7 | 0.7 | 0.7 |
| First Conductive Component | Average Particle Diameter of Silver Particle (μm) | 0.58 | 0.55 | 0.49 | 0.72 | 0.58 | N/A |

TABLE 6-continued

|  |  | Embodiment 33 | Embodiment 34 | Embodiment 35 | Embodiment 36 | Embodiment 37 | Comparative Example 4 |
|---|---|---|---|---|---|---|---|
|  | Particle Diameter of Silver Particle (μm) | 0.56~0.66 | 0.56~0.66 | 0.30~0.52 | 0.68~0.80 | 0.56~0.66 |  |
|  | Content in First Conductive Component (%) | 92 | 87 | 92 | 95 | 92 |  |
| Second Conductive Component | Particle Diameter of Silver Particle (μm) | N/A | N/A | N/A | N/A | 0.05 | N/A |
|  | Initial Electromagnetic Wave Shielding Performance (%) | 73.2 | 80.5 | 89.3 | 86.6 | 77.3 | 100 |
|  | Electromagnetic Wave Shielding Performance Variation (%) | 6.1 | 10.2 | 16.4 | 19.5 | 3.0 | 40.3 |

As can be seen from Table 6, the electromagnetic wave shielding material according to Comparative Example 4 had a remarkably large electromagnetic wave shielding performance variation compared to the embodiments.

Also, it can be seen that Embodiment 33, in which the first conductive component was within the preferable range of the present invention, was better in initial electromagnetic wave shielding performance and performance retention than Embodiments 34 to 36.

Meanwhile, it can be seen that the electromagnetic wave shielding material in Embodiment 37, in which the second conductive component was further included and additionally interposed in the crack generated in the nickel metal layer, had somewhat more deteriorated initial electromagnetic wave shielding performance than the electromagnetic wave shielding material according to Embodiment 33, in which no crack was generated. However, it can be seen that the electromagnetic wave shielding material in Embodiment 37 was better than that in Embodiment 33 in terms of performance retention despite an external force caused by additional elongation/contraction/recovery.

Embodiment 38

An electromagnetic wave shielding material was manufactured in the same way as in Embodiment 33, except that the fiber forming component and the solvent of the spinning solution were changed. In detail, a spinning solution was manufactured by dissolving 16 g of a fiber forming component obtained by mixing polyvinylidene fluoride and polyurethane at a weight ratio of 7:3 in 84 g of a solvent obtained by mixing dimethylacetamide and acetone at a weight ratio of 7:3 using a magnetic bar at a temperature of 60° C. for 6 hours. Thus, a conductive fiber web having a thickness of 20 μm, a basis weight of 9.85 g/m², a porosity of 49%, and an average pore diameter of 0.7 μm was manufactured, and the electromagnetic wave shielding material as shown in Table 7 below was manufactured by treating the conductive fiber web using a silver paste containing the first conductive component.

Embodiments 39 to 44

An electromagnetic wave shielding material as shown in Table 7 below was manufactured in the same way as in Embodiment 38, except that the content ratio between the PVDF and the polyurethane, which were contained in the fiber forming component, was changed as shown in Table 7 below.

Experimental Example 62

The electromagnetic wave shielding performance variation and the shape retention were evaluated on the electromagnetic wave shielding materials according to Embodiments 33 and 38 to 44 in the same way as in Experimental Example 2 that was described above, and then were shown in Table 7 below.

TABLE 7

|  |  | Embodiment 33 | Embodiment 38 | Embodiment 39 | Embodiment 40 | Embodiment 41 | Embodiment 42 | Embodiment 43 | Embodiment 44 |
|---|---|---|---|---|---|---|---|---|---|
| Fiber Forming Component | Weight Ratio of PVDF: polyurethane | 1:0.0 | 1:0.43 | 1:1.45 | 1:1.6 | 1:1.9 | 1:2.2 | 1:0.14 | 1:0.22 |
|  | Electromagnetic Wave Shielding Performance Variation (%) | 22.9 | 5.5 | 6.1 | 9.4 | 10.0 | 15.7 | 14.1 | 10.3 |
| Shape Retention | Presence of Damage | ○ | x | x | x | x | ○ | ○ | x |
|  | Area Variation (%) | N/A | 3.0 | 6.1 | 6.7 | 7.0 | N/A | N/A | 2.0 |

As can be seen from Table 7, as an elongation rate further increased in Embodiment 33, in which polyurethane was not included as the fiber forming component of the fiber part, than in Experimental Example 1, tearing occurred and also the electromagnetic wave shielding performance variation increased significantly.

Also, it can be seen that tearing occurred in Embodiment 43, in which polyurethane was contained but too little, or in Embodiment 42, in which polyurethane was excessively contained, and thus the electromagnetic wave shielding performance variation increased significantly.

Meanwhile, the tearing having occurred in Embodiment 42 despite an increase in amount of the polyurethane might be expected to be due to a result caused by the damage to the fiber part according to various solutions applied during a plating process.

Embodiment 45

A spinning solution was manufactured by dissolving 15 g of polyvinylidene fluoride in 85 g of dimethylacetamide and acetone, which were mixed at a weight ratio of 70:30, using a magnetic bar at a temperature of 80° C. for 6 hours. The spinning solution was poured into a solution tank of an electrospinning apparatus and then discharged at a rate of 20 μL/min/hole. In this case, a PVDF fiber web with an average diameter of 500 nm was manufactured by maintaining the temperature and humidity of the spinning section at 32° C. and 55%, setting a distance between a collector and a spinning nozzle tip to 16 cm, applying a voltage of 40 kV to a spin nozzle pack using a high voltage generator, and also applying an air pressure of 0.01 MPa per spin pack nozzle to form a twisted crimp in the fiber. Next, a calendering process was carried out on the fiber web by applying heat and pressure at 140° C. and 1 kgf/cm² in order to dry the remaining solvent and moisture.

Next, nickel, copper, and nickel were sequentially electroless-plated on the manufactured fiber web to form a metal shell part having a three-layer structure. In detail, nickel electroless plating was carried out on the fiber web first. To this end, the fiber web was immersed in a degreasing solution at 60° C. for 30 seconds, then cleaned with pure water, further immersed in an etching solution (5M NaOH, pure water) at 60° C. for 1 minute, and then cleaned with pure water. Subsequently, the fiber web was immersed in a catalyst solution (Pd 0.9%, HCl 20%, pure water) at room temperature for 3 minutes and then cleaned with pure water. Subsequently, the fiber web was immersed in a sulfuric acid solution (H₂SO₄ 85 ml/L, pure water) for catalytic activity at 50° C. for 30 seconds, cleaned with pure water, immersed in a nickel ion solution at 60° C. for 1 minute, and then cleaned with pure water to form a nickel layer having a thickness of 0.03 μm. Subsequently, the fiber web was cleaned, immersed in a copper ion solution at 40° C. for 3 minutes, and then cleaned with pure water to form a copper layer having a thickness of 1.0 μm. Subsequently, since nickel is difficult to plate on copper, a nanoweb plated with copper was immersed in the nickel ion solution for 30 seconds by applying electricity and then cleaned with pure water to form a nickel layer having a thickness of 0.04 μm and cover the fiber part of the fiber web with the metal shell part of the final three-layer structure consisting of nickel/copper/nickel. Thus, an electromagnetic wave shielding material, which was a conductive fiber web having a final thickness of 20 μm, a basis weight of 16.3 g/m², and a porosity of 45%, was manufactured as shown in Table 8 below.

Embodiment 46

An electromagnetic wave shielding material as shown in Table 8 below was manufactured in the same way as in Embodiment 45, except that the air gap and the air pressure were changed as shown in Table 8 below.

Comparative Example 5

An electromagnetic wave shielding material was manufactured in the same way as in Embodiment 45. However, a spinning solution was manufactured by dissolving 12 g of polyvinylidene fluoride in 85 g of dimethylacetamide and acetone, which were mixed at a weight ratio of 70:30, using a magnetic bar at a temperature of 80° C. for 6 hours. The spinning solution was poured into a solution tank of an electrospinning apparatus and then discharged at a rate of 20 μL/min/hole. In this case, a PVDF fiber web with an average diameter of 400 nm and with no crimp was manufactured by maintaining the temperature and humidity of the spinning section at 30° C. and 50%, setting a distance between a collector and a spinning nozzle tip to 20 cm, applying a voltage of 40 kV to a spin nozzle pack using a high voltage generator on the collector, and also applying an air pressure of 0.03 MPa per spin pack nozzle. Next, a calendering process was carried out on the fiber web by applying heat and pressure at 140° C. and 1 kgf/cm² in order to dry the remaining solvent and moisture. Subsequently, an electromagnetic wave shielding material having a thickness of 20 μm, a basis weight of 15 g/m², and a porosity of 50% was manufactured as shown in Table 8 below by forming a metal shell part of a three-layer structure consisting of nickel, copper, and nickel on the manufactured fiber web in the same way as in Embodiment 1.

Experimental Example 7

The following physical properties of the electromagnetic wave shielding materials according to Embodiments 45 and 46 and Comparative Example 5 were measured and shown in Table 8 below.

1. Initial Electromagnetic Wave Shielding Performance

The surface resistance of the electromagnetic wave shielding material was measured through a resistance meter (HIOKI 3540 mΩ HITESTER, HIOKI). The measured resistance value according to the embodiment was expressed by a relative percentage with respect to the measured resistance value of Comparative Example 1 being set to 100.

2. Evaluation of Electromagnetic Wave Shielding Performance Variation

A specimen was elongated in the transverse direction by a factor of 1.2 by means of a jig and then the surface resistance of the electromagnetic wave shielding material was measured while the elongation stress was eliminated. Then, a variation with respect to an initial resistance value A for each specimen was calculated using Equation 1 below. In this case, the variation being increased means that the electromagnetic wave shielding performance is deteriorated.

Variation (%)=(B−A)×100÷A  [Equation 1]

3. Evaluation of Mechanical strength due to Elongation

A specimen was observed with the naked eye while the specimen was being elongated in the transverse direction using a jig. A force applied when damage such as tearing occurred in the electromagnetic wave shielding material was expressed as the magnification of the increased initial transverse length with respect to the initial transverse length.

TABLE 8

| | Embodiment 45 | Embodiment 46 | Comparative Example 5 |
|---|---|---|---|
| Air Gap (cm) | 15 | 17 | 20 |
| Air Pressure (MPa) | 0.01 | 0.02 | 0.03 |
| Presence of Crimp | Yes | Yes | No |
| Initial Electromagnetic Wave Shielding Performance (%) | 99.9 | 100 | 100 |

TABLE 8-continued

|  | Embodiment 45 | Embodiment 46 | Comparative Example 5 |
|---|---|---|---|
| Electromagnetic Wave Shielding Performance Variation (%) | 4 | 8 | 27.5 |
| Mechanical strength due to Elongation (times) | 1.67 | 1.53 | 1.29 |

As can be seen from Table 8, Embodiment 45 and Embodiment 46, in which a crimp was formed, had a lower electromagnetic wave shielding performance variation than Comparative Example 5. This was expected to be due to an effect in which a space in a crack of the metal shell part was reduced due to exhibition of elastic properties despite elongation in one axial direction.

Embodiment 47, except that the content ratio between the PVDF and the polyurethane, which were contained in the fiber forming component, was changed as shown in Table 9 below.

Experimental Example 8

The electromagnetic wave shielding performance retention and the shape retention were evaluated on the electromagnetic wave shielding materials according to Embodiments 45 and 47 to 53 in the same way as in Experimental Example 2 that was described above, and then were shown in Table 9 below. In this case, for the electromagnetic wave shielding performance retention, unlike Experimental Example 2, a specimen was elongated by a factor of 1.8 in the transverse direction and in the longitudinal direction. This process was repeated three times.

TABLE 9

|  |  | Embodiment 45 | Embodiment 47 | Embodiment 48 | Embodiment 49 | Embodiment 50 | Embodiment 51 | Embodiment 52 | Embodiment 53 |
|---|---|---|---|---|---|---|---|---|---|
| Fiber Forming Component | Weight Ratio of PVDF: polyurethane | 1:0.0 | 1:0.43 | 1:1.45 | 1:1.6 | 1:1.9 | 1:2.2 | 1:0.14 | 1:0.22 |
|  | Electromagnetic Wave Shielding Performance Variation (%) | 24.8 | 2.5 | 3.1 | 11.4 | 12.0 | 20.7 | 23.1 | 10.3 |
| Shape Retention | Presence of Damage | ○ | x | x | x | x | ○ | ○ | x |
|  | Area Variation (%) | N/A | 1.8 | 2.6 | 3.5 | 3.6 | N/A | N/A | 2.9 |

Meanwhile, it can be seen that Embodiments 45 and 46, in which a crimp was formed, also had a significantly better mechanical strength due to elongation than Comparative Example 5.

Embodiment 47

An electromagnetic wave shielding material was manufactured in the same way as in Embodiment 45, except that the fiber forming component and the solvent of the spinning solution were changed. In detail, a spinning solution was manufactured by dissolving 16 g of a fiber forming component obtained by mixing polyvinylidene fluoride and polyurethane at a weight ratio of 7:3 in 84 g of a solvent obtained by mixing dimethylacetamide and acetone at a weight ratio of 7:3 using a magnetic bar at 60° C. for 6 hours. The spinning solution was poured into a solution tank of an electrospinning apparatus and discharged at a rate of 20 µL/min/hole. In this case, a fiber web formed of a PVDF/PU composite nanofiber with a crimp was manufactured by maintaining the temperature and humidity of the spinning section at 32° C. and 55%, setting a distance between a collector and a spinning nozzle tip to 16 cm, applying a voltage of 40 kV to a spin nozzle pack using a high voltage generator, and also applying an air pressure of 0.01 MPa per spin nozzle pack. Then, an electromagnetic wave shielding material as shown in Table 9 below was manufactured by forming a conductive part, which was a metal shell having a three-layer structure like Embodiment 45.

Embodiments 48 to 53

An electromagnetic wave shielding material as shown in Table 9 below was manufactured in the same way as in As can be seen from Table 9, as an elongation rate further increased in Embodiment 45, in which polyurethane was not included as the fiber forming component of the fiber part, than in Experimental Example 1, tearing occurred and also the electromagnetic wave shielding performance variation increased significantly.

Also, it can be seen that tearing occurred in Embodiment 52, in which polyurethane was contained but too little, or in Embodiment 51, in which polyurethane is excessively contained, and thus the electromagnetic wave shielding performance variation increased significantly.

Meanwhile, the tearing having occurred in Embodiment 51 despite an increase in amount of the polyurethane might be expected to be due to a result caused by the damage to the fiber part according to various solutions applied during a plating process.

Manufacturing Example

In order to manufacture a conductive adhesive layer, a mixture solution was manufactured by mixing 7 parts by weight of nickel particles having an average particle diameter of 3 µm with 100 parts by weight of the conductive adhesive composition containing an acrylic adhesive forming component by means of a mixing mixer. A release PET film was coated with the manufactured mixture solution using a bar coater, laminated with the conductive fiber web manufactured according to Embodiment 1 on the coated surface, coated with the mixture solution again, and laminated with a release PET film. Then, a calendering process was carried out. In order to cure the acrylic adhesive layer, a heat curing process was performed on the laminated conductive shielding material at 120° C. for 24 hours. Thus, the conductive adhesive layer was formed on both surfaces of the conductive fiber web to a predetermined thickness, and the remaining portion of the conductive adhesive layer was utilized to manufacture the electromagnetic wave shielding material disposed inside the conductive fiber web.

While embodiments of the present invention have been described above, the scope of the present invention is not limited to the disclosed embodiments. Those skilled in the art of the present invention can readily suggest another embodiment by adding, modifying, or deleting components without departing from the scope of the present invention, but the suggested embodiment is construed as being within the scope of the present invention.

The invention claimed is:

1. A flexible electromagnetic wave shielding material comprising:
 a conductive fiber web including a conductive composite fiber including a metal shell part covering an outside of a fiber part such that the conductive composite fiber forms multiple pores; and
 a first conductive component provided in at least some of the pores,
 wherein the first conductive component contains metal particles, and 90% or more of the total metal particles have particle diameters 0.8 times to 0.95 times an average pore diameter of the pores.

2. The flexible electromagnetic wave shielding material of claim 1, wherein in order to prevent an increase in resistance due to a crack generated in the metal shell part, the first conductive component is provided in the pores to be in contact with at least a portion of the conductive composite fiber to provide electrical connection to the crack.

3. The flexible electromagnetic wave shielding material of claim 1, wherein the conductive composite fiber has a diameter of 0.2 μm to 10 μm.

4. The flexible electromagnetic wave shielding material of claim 1, wherein the conductive fiber web has a thickness of 5 μm to 200 μm and a basis weight of 5 g/m² to 100 g/m².

5. The flexible electromagnetic wave shielding material of claim 1, wherein the metal shell part has a crack formed in at least a portion, and
the flexible electromagnetic wave shielding material further comprises a second conductive component interposed in a gap of the crack to provide electrical connection to the gap.

6. The flexible electromagnetic wave shielding material of claim 1, wherein the fiber part includes polyvinylidene fluoride (PVDF) and polyurethane at a weight ratio of 1:0.2 to 1:2 as a fiber forming component.

7. The flexible electromagnetic wave shielding material of claim 1, wherein the first conductive component contains one or more of a conductive polymer compound and one or more types of metals selected from a group consisting of aluminum, nickel, copper, silver, gold, chromium, platinum, titanium alloys, and stainless steel.

8. The flexible electromagnetic wave shielding material of claim 1, wherein the metal shell part contains one or more types of metals selected from a group consisting of aluminum, nickel, copper, silver, gold, chromium, platinum, titanium alloys, and stainless steel.

9. The flexible electromagnetic wave shielding material of claim 1, wherein the metal shell part has a thickness of 0.1 μm to 2 μm.

10. The flexible electromagnetic wave shielding material of claim 1, wherein the conductive fiber web has a porosity of 30% to 80%.

11. The flexible electromagnetic wave shielding material of claim 1, wherein a conductive adhesive layer is further provided on at least one surface of the conductive fiber web.

12. An electromagnetic wave shielding-type circuit module comprising:
 a circuit board with a device mounted thereon; and
 the electromagnetic wave shielding material according to claim 1, the electromagnetic wave shielding material provided on the circuit board to cover at least an upper portion and a lateral portion of the device.

13. An electronic device comprising the electromagnetic wave shielding-type circuit module according to claim 12.

* * * * *